United States Patent
Shimizu

(10) Patent No.: US 9,207,289 B2
(45) Date of Patent: Dec. 8, 2015

(54) MAGNETIC PROPERTY ANALYZING METHOD AND APPARATUS

(71) Applicant: FUJITSU LIMITED, Kawasaki-shi (JP)

(72) Inventor: Koichi Shimizu, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 627 days.

(21) Appl. No.: 13/652,683

(22) Filed: Oct. 16, 2012

(65) Prior Publication Data

US 2013/0166230 A1 Jun. 27, 2013

(51) Int. Cl.
*G06F 19/00* (2011.01)
*G01R 33/00* (2006.01)

(52) U.S. Cl.
CPC .................................. *G01R 33/0064* (2013.01)

(58) Field of Classification Search
CPC .................................................. G01F 17/5036
USPC .............................. 702/57, 66, 115, 112, 124
See application file for complete search history.

(56) References Cited

U.S. PATENT DOCUMENTS

2009/0160896 A1 6/2009 Yamagata et al.
2013/0006593 A1* 1/2013 Uehara ............................ 703/2

FOREIGN PATENT DOCUMENTS

JP 2009-148993 7/2009

OTHER PUBLICATIONS

Internet/Google NPL searched of inventor and magnetic property analyzing and LLG.*

* cited by examiner

*Primary Examiner* — Tung S Lau
(74) *Attorney, Agent, or Firm* — Fujitsu Patent Center

(57) ABSTRACT

A magnetic property analyzing apparatus calculates vector potentials of each of elements to which an analyzing target is segmented by meshing, using an average magnetization obtained for each of the elements, and performs a magnetic field analysis of sub-grids arranged along one direction within each of the elements. An average magnetization with respect to each of the elements is calculated by performing a time integral on a LLG (Landau Lifshitz Gilbert) equation using a magnetic field obtained from the magnetic field analysis in order to perform a magnetic property analysis.

17 Claims, 26 Drawing Sheets

MAGNETIC PROPERTY ANALYZING METHOD AND APPARATUS

CROSS-REFERENCE TO RELATED APPLICATIONS

This application is based upon and claims the benefit of priority of the prior Japanese Patent Application No. 2011-280540, filed on Dec. 21, 2011, the entire contents of which are incorporated herein by reference.

FIELD

The embodiments discussed herein are related to a magnetic property analyzing method, a magnetic property analyzing apparatus, and a computer-readable storage medium having stored therein a program for causing a computer to execute a magnetic property analyzing process.

BACKGROUND

Conventionally, a simulation may be performed by a computer to analyze magnetic properties, when analyzing characteristics or loss of devices (motors, transformers, etc.) that use magnetic materials. The simulation may employ the magnetic field analysis technique utilizing the FEM (Finite Element Method). When the magnetic field analysis technique utilizing the FEM is employed, an analyzing target may be segmented into small meshes in order to enable analysis of complex shapes.

On the other hand, the micromagnetics is an example of another technique that may be employed to analyze the magnetic properties. When the micromagnetics is employed, the computer may reproduce magnetic domains of the magnetic material with a high accuracy.

For example, a Japanese Laid-Open Patent Publication No. 2009-148993 proposes a magnetic property analyzing apparatus that creates a first equation for computing the magnetic field from current vectors generated from the analyzing target, in a format analyzable by the FEM and the boundary integral approach. The proposed magnetic property analyzing apparatus creates a second equation for computing the magnetic field from magnetization vectors generated from the analyzing target, in the format analyzable by the FEM and the boundary integral approach. A first magnetic field and a second magnetic field may be computed from the first equation and the second equation, respectively, in order to obtain an analysis result on the magnetic field at the analyzing target based on a combined magnetic field computed from the first equation and the second equation.

However, when the FEM and another technique or approach are used to analyze the magnetic properties, as is the case of the proposed magnetic property analyzing apparatus described above, the number of elements (or meshes) obtained by the meshing (or segmenting into the meshes) according to the FEM may become large. For example, in a case in which the analyzing target is a thin plate-shaped magnetic material, it may be difficult to analyze the effects caused by a change in the magnetic flux parallel to the plate surface unless the meshing is performed in a direction along the plate thickness. On the other hand, from the point of view of analyzing the magnetic properties, it may be preferable for the shape of the meshes to be close to a cube. For this reason, a large number of meshes are generated when the meshing is performed in the direction along the plate thickness so as to have the cubic shape, and as a result, a delay may be generated in analyzing the magnetic properties.

SUMMARY

Accordingly, it is an object in one aspect of the embodiment to analyze magnetic properties at a high speed and with a high accuracy.

According to one aspect of the present invention, a magnetic property analyzing apparatus may include a processor including a vector potential calculator, a magnetic field analyzer, and an average magnetization calculator, wherein the vector potential calculator is configured to calculate vector potentials of each of elements to which an analyzing target is segmented by meshing, using an average magnetization obtained for each of the elements, wherein the magnetic field analyzer is configured to perform a magnetic field analysis of sub-grids arranged along one direction within each of the elements, and wherein the average magnetization calculator is configured to calculate an average magnetization with respect to each of the elements, by performing a time integral on a LLG (Landau Lifshitz Gilbert) equation using a magnetic field obtained from the magnetic field analysis in order to perform a magnetic property analysis.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be described with reference to the accompanying drawings.

A description will now be given of the magnetic property analyzing method, the magnetic property analyzing apparatus, and the computer-readable storage medium in each embodiment according to the present invention.

[Structure]

Figure 1:
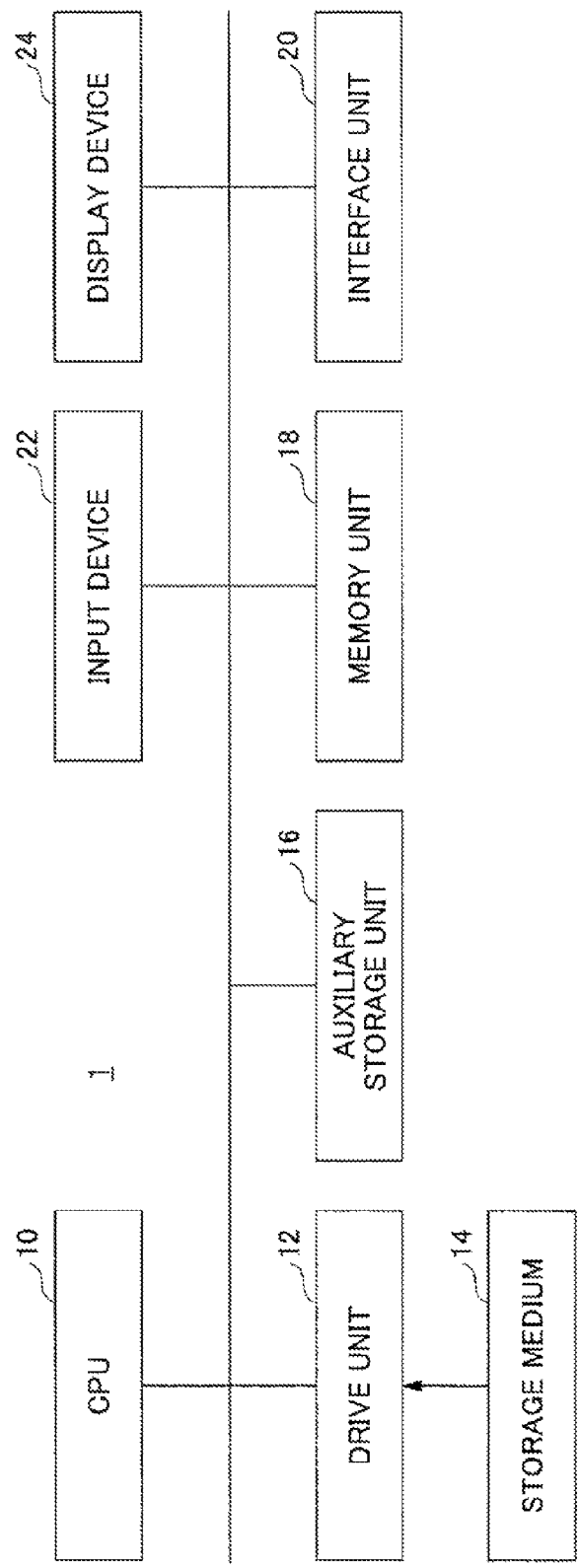
FIG. 1 is a block diagram illustrating an example of a hardware structure of a magnetic property analyzing apparatus in an embodiment of the present invention.

FIG. 1 is a block diagram illustrating an example of a hardware structure of a magnetic property analyzing apparatus in an embodiment of the present invention. A magnetic property analyzing apparatus 1 illustrated in FIG. 1 may include a CPU (Central Processing Unit) 10, a drive unit 12, an auxiliary storage unit 16, a memory unit 18, an interface unit 20, an input device 22, and a display unit 24, which may be connected via a bus, a serial transmission line, and the like, for example.

The CPU 10 is an example of a processor forming a computing unit. For example, the CPU 10 may include a program counter, an instruction decoder, various arithmetic units, a LSU (Load Store Unit), a general-purpose register, and the like.

The drive unit 12 may read data and programs stored in a storage medium 14. When the storage medium 14 storing the program is loaded into the drive unit 12, the program may be installed into the auxiliary storage unit 16 from the storage medium 14 via the drive unit 12. For example, the storage medium 14 may be formed by a portable storage medium such as a CD (Compact disk), a DVD (Digital Versatile Disk), a USB (Universal Serial Bus) memory, and the like. In addition, the auxiliary storage unit 16 may be formed by a HDD (Hard Disk Drive), a flash memory, and the like.

In addition to installing the program from the storage medium 14, the program may be downloaded from another computer via a network and the interface unit 20 to be installed into the auxiliary storage unit 16. The network may be formed by a LAN (Local Area Network), a wireless network, and the like. The network may be a cable network, a wireless network, or a combination of cable and wireless networks. In addition, the program may be stored in the auxiliary storage unit 16 or a ROM (Read Only Memory) in advance when forwarding the magnetic property analyzing apparatus 1.

The CPU 10 may execute the program that is installed or stored in advance in the manner described above, in order to cause a information processing apparatus illustrated in FIG. 1 to function as the magnetic property analyzing apparatus 1 of this embodiment.

For example, the memory unit 18 may be formed by a RAM (Random Access Memory), a EEPROM (Electrically Erasable Programmable Read Only Memory), a flash memory, and the like. The interface unit 20 may control connections of the magnetic property analyzing apparatus 1 to the network, and the like.

A non-transitory computer-readable storage medium that stores the program may be formed by any of the storage medium 14, the auxiliary storage unit 16, and the memory unit 18.

For example, the input device 22 may be formed by a keyboard, a mouse, buttons, a touch-pad, a touch-screen panel, a microphone, and the like. In addition, the display unit 24 may be formed by a LCD (Liquid Crystal Display), a CRT (Cathode Ray Tube), and the like, for example. The magnetic property analyzing apparatus 1 may include an output device other than the display unit 24, such as a printer, a speaker, and the like.

Figure 2:
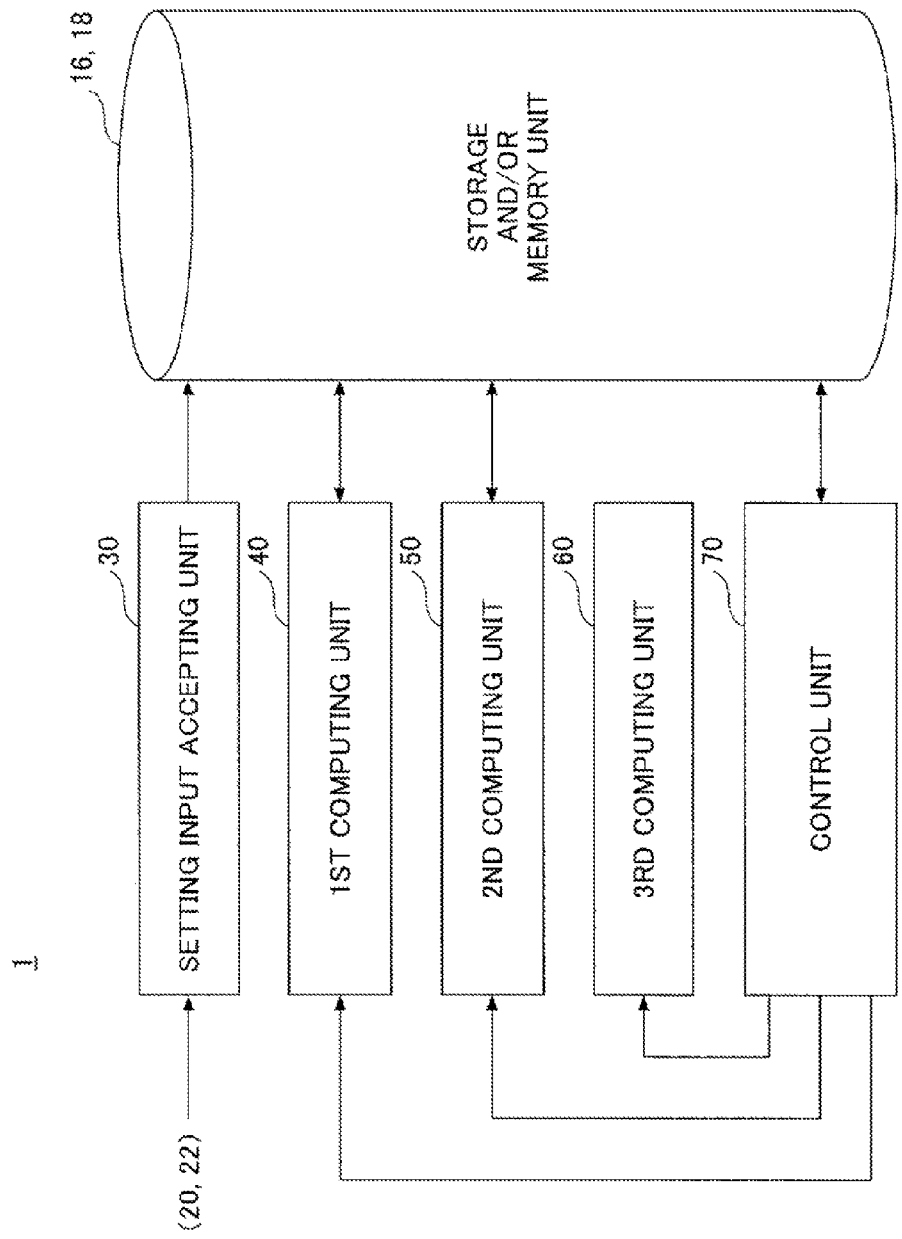
FIG. 2 is a diagram illustrating an example of a functional structure of the magnetic property analyzing apparatus in a first embodiment.

FIG. 2 is a diagram illustrating an example of a functional structure of the magnetic property analyzing apparatus in a first embodiment. The magnetic property analyzing apparatus 1 illustrated in FIG. 2 may include a setting input accepting unit 30, a first computing unit 40, a second computing unit 50, a third computing unit 60, and a control unit 70. Functions of these functional blocks 30, 40, 50, 60, and 70 may be realized by executing one or more programs (or software) stored in the auxiliary storage unit 16 and the like by the CPU 10. The functions of these functional blocks 30, 40, 50, 60, and 70 may be realized by separate programs or by subroutines or functions that are called from another program. In addition, a portion of the functions of each functional block may be realized by hardware, such as a LSI (Large Scale Integrated circuit), an IC (Integrated Circuit), a FPGA (Field Programmable Gate Array), and the like.

The setting input accepting unit 30 may accept input of various parameter settings, physical property information of the analyzing target, and the like. The various parameters may include a number N of transient magnetic field calculation steps to compute the magnetic field, a number M1 of iterations of a sub-grid magnetic field analysis and a LLG (Landau Lifshitz Gilbert) time integral, a LLG loop number M2 (number of LLG loops), a convergence judging threshold value ε, an amount of change per unit time of an external magnetic field, a degree of freedom P, and the like. In addition, the physical property information may include values of fundamental physical properties, properties of the material, anisotropy settings, and the like. These settings may be input via the interface unit 20 or the input device 22, in order to store the input data in the auxiliary storage unit 15 or the memory unit 18.

The first computing unit 40 may perform a macro magnetic field analysis (that is, magnetic analysis of macro elements) utilizing the FEM. More particularly, the first computing unit 40 may function as a vector potential calculator (or unit, or module) to calculate vector potentials of each of the elements, using an average magnetization obtained for each of the elements to which the analyzing target is segmented by the meshing. In addition, the second computing unit 50 may function as a magnetic field analyzer (or unit, or module) to perform a sub-grid magnetic field analysis (that is, magnetic analysis of sub-grids and sub-elements) utilizing the FEM. Further, the third computing unit 60 may perform a magnetic property analysis based on the micromagnetics. More particularly, the third computing unit 60 may function as an average magnetization calculator (or unit, or module) to calculate the average magnetization for each of the elements, by performing a time integral on the LLG equation using the magnetic field obtained by the magnetic field analysis that uses the sub-grids.

Next, a description will be given of the FEM, the micromagnetics, and the sub-grids of the FEM.

[FEM, Micromagnetics, Sub-Grids]
(FEM)

Figure 3:
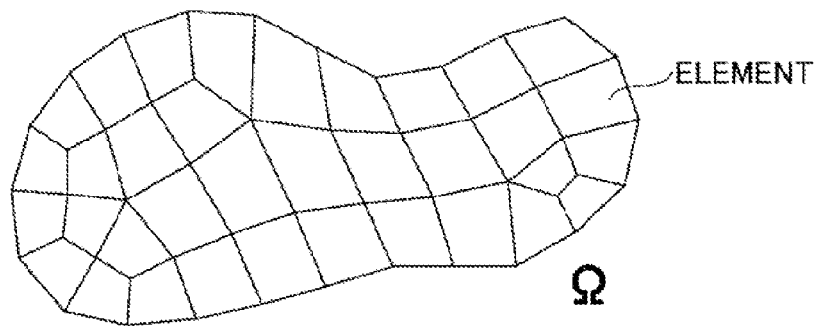
FIG. 3 is a diagram illustrating a state in which an analyzing target is segmented into meshes according to the FEM.

The FEM may segment the analyzing target into a finite number of small regions (or elements) called meshes, in order to obtain a solution. A differential equation that governs the physical states of fluids, structures, magnetic fields, and the like may generally be referred to as a governing equation, in which physical quantities (continuous fields) continuously defined within the air or the material such as solid or fluid are unknown. The FEM is one method of numerically obtaining an approximate solution to the differential equation that may be difficult to solve analytically. The FEM may segment a definition region Ω of the governing equation originally having an infinite degree of freedom into a finite number of small regions (or elements) called meshes, in order to obtain the solution. FIG. 3 is a diagram illustrating a state in which the analyzing target is segmented into the meshes according to the FEM.

Figure 4:
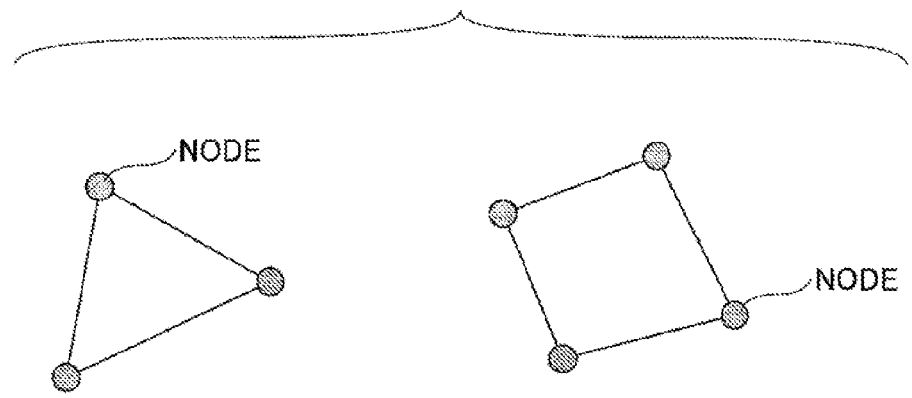
FIG. 4 is a diagram illustrating a triangular element and a rectangular element formed by a plurality of nodes.

The element is a region of a minimum unit obtained by segmenting the region of the analyzing target, and may be formed by a plurality of nodes. FIG. 4 is a diagram illustrating a triangular element and a rectangular element respectively formed by a plurality of nodes. Because the FEM forms the entire model by the small elements in order to obtain the solution, even an analyzing target region having a complex shape may be analyzed.

The Galerkin method (or MWR (Method of Weighted Residuals)) is one example of the magnetic field analyzing technique utilizing the FEM. The Galerkin method may multiply a weighting function having an arbitrary shape on both sides of the governing equation, and obtain a spatial integral in order to effectively reduce the degree of freedom (or perform discretization).

The following equation (1) is a governing equation representing a spatial distribution of a physical variable ø, where ø depends on a space X. According to the FEM, the governing equation may be treated as the following linear equation (2) in the process of obtaining the solution, even when the governing equation is nonlinear. In the linear equation (2), F denotes a function of an operator of a spatial differentiation with respect to ø, and $F_0$ denotes a constant that does not depend on ø.

$$f(\vec{x}, \phi) = 0 \tag{1}$$

$$F(\vec{x})\phi + F_0 = 0 \tag{2}$$

Figure 5:
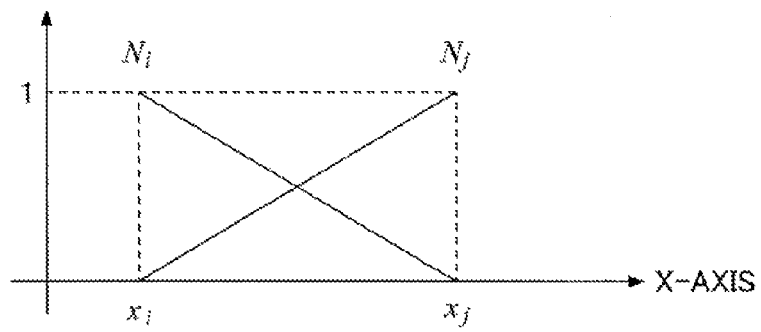
FIG. 5 is a diagram representing a one-dimensional interpolation function N on a one-dimensional coordinate.

The solution ø within the element having N nodes may be approximated by the following equation (3) using the interpolation function N. In the equation (3), $ø_i$ denotes the value of the field at a position $x_i$, and n denotes the number of nodes. In addition, a weighting function w(x) may be defined by the following equation (4) using the interpolation function N. The value of the interpolation function N at the position $x_i$ may have properties represented by the following equation (5). FIG. 5 is a diagram illustrating a one-dimensional interpolation function N on a one-dimensional coordinate.

$$\phi(x) = \sum_{i=1}^{n} \phi_i N_i(x) \tag{3}$$

$$w(x) = \sum_{i=1}^{n} w_i N_i(x) \tag{4}$$

$$N_i(x_j) = \delta_{ij} \tag{5}$$

Next, a description will be given of a technique to solve an equation defined in a two-dimensional space by utilizing the FEM. First, an arbitrary weighting function w is multiplied to both sides of the equation (2), and a surface integral is obtained, to thereby obtain the following equation (6). In addition, when the weighting function w and the solution ø to be obtained are represented using the interpolation function N, the following equation (7) represents the equation for one element.

$$\int_S wF(\vec{x})\phi dS + \int_S wF_0 dS = 0 \tag{6}$$

$$\sum_{i=1}^{n}\sum_{j=1}^{n}\int_S w_i N_i F(\vec{x})\phi_j N_j dS + \sum_{j=1}^{n}\int_S w_i N_i F_0 dS = 0 \tag{7}$$

By performing the spatial integral in the manner described above, the degree of freedom of the space deteriorates, and as a result, an equation related to the unknown ø is obtained. Because the number of equations related to $ø_j$ thus obtained corresponds to the number n of the arbitrary weighting functions, the solution ø may be obtained by solving the simultaneous equations.

(Applying FEM to Magnetic Field Analysis)

The magnetic field for a case in which a magnetization vector →M exists in air may be represented by the following equation (8). In the following description, an alphabet or symbol with an arrow indicated on top in the equations will be represented by the alphabet or symbol preceded by an arrow, such as "→A". In addition, < > represents an average. In the equation (8), →A denotes a vector potential, $v_0$ denotes an inverse number of the space permeability (absolute permeability of vacuum), →$J_0$ denotes an exciting current, and →M denotes the magnetization vector.

$$\frac{\partial \vec{A}}{\partial t} + \vec{\nabla} \times v_0 \vec{\nabla} \times \vec{A} = \vec{J}_0 + v_0 \vec{\nabla} \times \vec{M} \tag{8}$$

The following equation (9) may be obtained when the weighting function w is multiplied to both sides of the equation (8), and the spatial integral is obtained for one element.

$$\int_V \sum_{i=1}^n \sum_{j=1}^n w_i N_i N_j \frac{\partial \vec{A}_j}{\partial t} dV + \int_V \sum_{i=1}^n \sum_{j=1}^n w_i N_i (\vec{\nabla} \times v_0 \vec{\nabla} \times N_j \vec{A}_j) dV = \int_V \sum_{i=1}^n w_i N_i \vec{J}_0 dV + \int_V \sum_{i=1}^n w_i N_i v_0 (\vec{\nabla} \times \vec{M}) dV \tag{9}$$

Further, when an integration by parts is performed on a second term on the left side of the equation (9), the following equation (10) may be obtained.

$$\int_V \sum_{i=1}^n \sum_{j=1}^n w_i N_i (\vec{\nabla} \times v_0 \vec{\nabla} \times N_j \vec{A}_j) dV \vec{A}_j = \tag{10}$$

$$- \int_V \sum_{i=1}^n \sum_{j=1}^n w_i v_0 (\vec{\nabla} N_i \times \vec{\nabla} \times N_j \vec{A}_j) dV +$$

$$\int_S \sum_{i=1}^n \sum_{j=1}^n w_i N_i \vec{n} \times v_0 (\vec{\nabla} \times N_j) \vec{A}_j \cdot d\vec{S} =$$

$$- \int_V \sum_{i=1}^n \sum_{j=1}^n w_i v_0 (\vec{\nabla} N_i \times \vec{\nabla} \times N_j) \vec{A}_j dV + \int_V \sum_{i=1}^{nf} w_i N_i \vec{n} \times \vec{B} \cdot d\vec{S}$$

In the process of deriving a second term on the right side of the equation (10), the following relation equation (11) is used, In addition, a term derived from the magnetization vector M→ may be substituted by the following equation (12) by integration by parts.

$$\sum_{j=1}^n (\vec{\nabla} \times N_j) \vec{A}_j = \vec{B} \tag{11}$$

$$\int_V \sum_{i=1}^n w_i N_i v_0 (\vec{\nabla} \times \vec{M}) dV = -\int_V \sum_{i=1}^n w_i v_0 (\vec{\nabla} N_i \times \vec{M}) dV \tag{12}$$

Coefficients $c_{ij}$, $d_{ij}$, $e_i$, $f_i$, and $g_i$ obtained by the spatial integral of the equation (9) may be represented by the following equations (13) through (17).

$$c_{ij} = \int_V N_i N_j dV \tag{13}$$

$$d_{ij} = \int_V v_0 (\vec{\nabla} N_i \times \vec{\nabla} \times N_j) dV \tag{14}$$

$$e_i = \int_V N_i dV \tag{15}$$

$$\vec{f}_i = \int_V v_0 \vec{\nabla} N_i dV \tag{16}$$

$$g_i = \int_V N_i dS \tag{17}$$

In addition, when the equation (9) is regarded as an identity with respect to a weight $w_i$ having an arbitrary value, the coefficient of the weight $w_i$ becomes zero, and the following simultaneous equation (18) may be obtained.

$$c_{ij} \frac{\partial \vec{A}_j}{\partial t} + d_{ij} \vec{A}_j = e_i \vec{J}_0 + \vec{f}_i \times \vec{M} - g_i \vec{B} \tag{18}$$

The equation (18) is a simultaneous equation related to an unknown $A_j$ in one element. By combining the simultaneous equations related to the unknown $A_j$ with respect to all of the elements, a simultaneous equation for the entire definition region may be obtained. When indexes i and j in the simultaneous equation (18) in units of elements are respectively substituted by indexes I and J for the entire region, and the following equation (19) may be obtained by a method of solution by division with respect to times n and n+1. When an unknown $A_j^{n+1}$ in the equation (19) is moved to the left side, the following equation (20) may be obtained.

$$c_{IJ} \frac{\vec{A}_J^{n+1} - \vec{A}_J^n}{\Delta t} + d_{IJ} \vec{A}_J^{n+1} = e_I \vec{J}_0 + \vec{f}_I \times \vec{M} - g_I \vec{B} \tag{19}$$

$$\left(\frac{c_{IJ}}{\Delta t} + d_{IJ}\right) \vec{A}_J^{n+1} = -\frac{c_{IJ}}{\Delta t} \vec{A}_J^n + e_I \vec{J}_0 + \vec{f}_I \times \vec{M} - g_I \vec{B} \tag{20}$$

A solution $A_j^{n+1}$ at a time n+1 may be obtained by solving the simultaneous equation related to the unknown $A_j^{n+1}$ as represented by the following equation (21). In a general case in which the magnetic flux does not flow into or out of the boundary of the analyzing region, the vector →B in the equation (21) becomes zero, and the following equation (22) stands.

$$\vec{A}_J^{n+1} = \left(\frac{c_{IJ}}{\Delta t} + d_{IJ}\right)^{-1} \left(-\frac{c_{IJ}}{\Delta t} \vec{A}_J^n + e_I \vec{J}_0 + \vec{f}_I \times \vec{M} - g_I \vec{B}\right) \tag{21}$$

$$\vec{A}_J^{n+1} = \left(\frac{c_{IJ}}{\Delta t} + d_{IJ}\right)^{-1} \left(-\frac{c_{IJ}}{\Delta t} \vec{A}_J^n + e_I \vec{J}_0 + \vec{f}_I \times \vec{M}\right) \tag{22}$$

A magnetic flux density $B^{n+1}$ represented by the following equation (23) may be obtained from the vector potential $A_j^{n+1}$ that is obtained as the solution, where N denotes the interpolation function, and $B^{n-1}$ denotes the value in the target element.

$$\vec{B}^{n+1} = \sum_{i=1}^n \vec{\nabla} N_i \times \vec{A}_i \tag{23}$$

A magnetic field $H_j^{n+1}$ may be obtained from the following equation (24) using the magnetic flux density $B^{n-1}$ represented by the equation (23).

$$\vec{H}^{n+1} = v_0\left(\vec{B}^{n+1} - \vec{M}\right) \quad (24)$$

(Magnetic Property Representation Method Based on Micromagnetics)

The third computing unit 60 in this embodiment may integrate the LLG (Landau Lifshitz Gilbert) equation of the micromagnetics, and obtain the magnetization vector →M in the steady state in which the LLG equation becomes less than a predetermined value. The LLG equation may be represented by the following equation (25). The LLG equation may be used to analyze the magnetic properties and the magnetic domain structure of the magnetic material. In the equation (25), →$M_i$ denotes the magnetization vector, →$H_{eff}$ denotes the effective magnetic field acting on the magnetization vector, γ denotes a gyro magnetic constant (Hz·m/A), and α denotes a damping constant.

$$\frac{d\vec{M}_i}{dt} = \gamma \vec{M}_i \times \vec{H}_{eff} - \gamma\alpha \vec{M}_i \times \vec{M}_i \times \vec{H}_{eff} \quad (25)$$

The effective magnetic field acting on the magnetization vector may be represented by the following equation (26). In the equation (26), →$H_{ani}$ denotes a magneto crystalline anisotropy field, →$M_{exc}$ denotes a magnetic exchange coupling field, →$H_{external}$ denotes the external magnetic field, and →H denotes other magnetic fields (static magnetic field, fields caused by exciting current, eddy current, etc.).

$$\vec{H}_{eff} = \vec{H}_{ani} + \vec{H}_{exc} + \vec{H} + \vec{H}_{external} \quad (26)$$

The LLG equation may be used to analyze the magnetic properties and the magnetic domain structure of the magnetic model having a plurality of partial structures. The magnetization vector of each individual partial structure obtained by solving the LLG equation may be arranged at a position in the respective space, and the magnetic fields (static magnetic field, exchange coupling field) caused by the spatial distribution of the magnetization vector may contribute to the magnetic properties. However, even when the effects of the magnetic fields (static magnetic field, exchange coupling field) depending on the spatial distribution of the magnetization vector are reduced, the magnetic properties of the magnetic material may be reproduced by approximation. Accordingly, the magnetic properties of the magnetic material may be reproduced by approximation, by applying the LLG equation with respect to a parallelepiped model having a suitable size by neglecting the detailed geometrical shape in order to compute the magnetization vectors, and obtaining an average value of the magnetization vectors.

Figure 6:
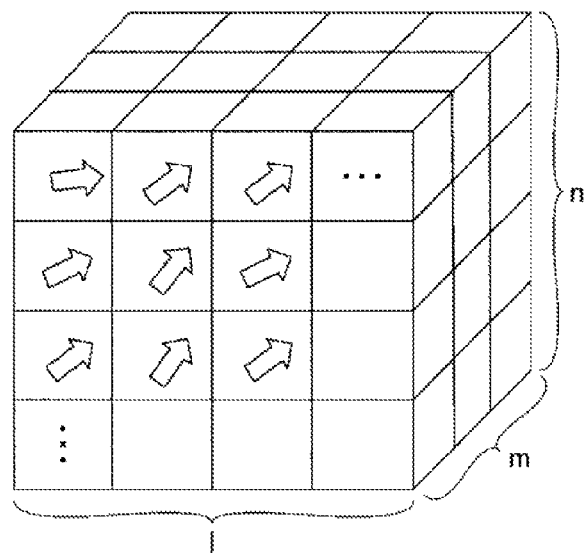
FIG. 6 is a diagram illustrating a plurality of magnetization vectors forming a cube.

FIG. 6 is a diagram illustrating a plurality of magnetization vectors computed for each of the internal structures forming a cube. In FIG. 6, arrows denote directions of the magnetization vectors.

When a number P (or degree of freedom) of the magnetization vectors is represented by P=1×m×n as illustrated in FIG. 6, the average value of the magnetization vectors (or average magnetization) may be represented by the following equation (27).

$$\langle \vec{M} \rangle = \frac{1}{N}\sum_{i=1}^{N} \vec{M}_i \quad (27)$$

Figure 7:
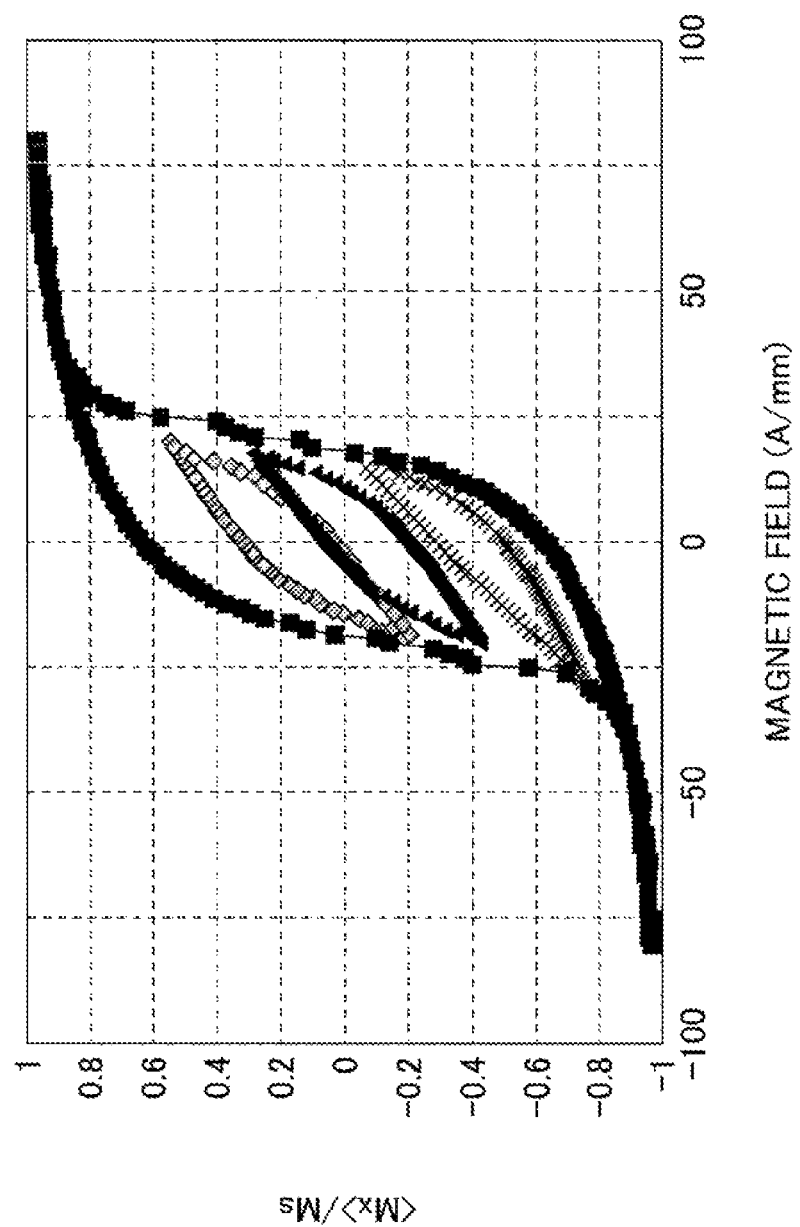
FIG. 7 is a diagram for explaining a relationship between an average value of the magnetization vectors and an external magnetic field.

FIG. 7 is a diagram illustrating a relationship of the average value of the magnetization vectors and the external magnetic field. As illustrated in FIG. 7, magnetic hysteresis may be reproduced accurately by using the average value of the magnetization vectors.

When the LLG equation is applied to the magnetic material, the size of the magnetic material that may be treated becomes limited to several hundred microns. Hence, in the magnetic property analyzing apparatus 1 in this embodiment, the LLG equation is applied with respect to each element that is obtained by segmenting the analyzing target into the meshes utilizing the FEM. As a result, the magnetic properties may be analyzed using the LLG equation, regardless of the shape of the analyzing target or the size of the analyzing target.

(Introduction of Sub-Grids)

Figure 8:
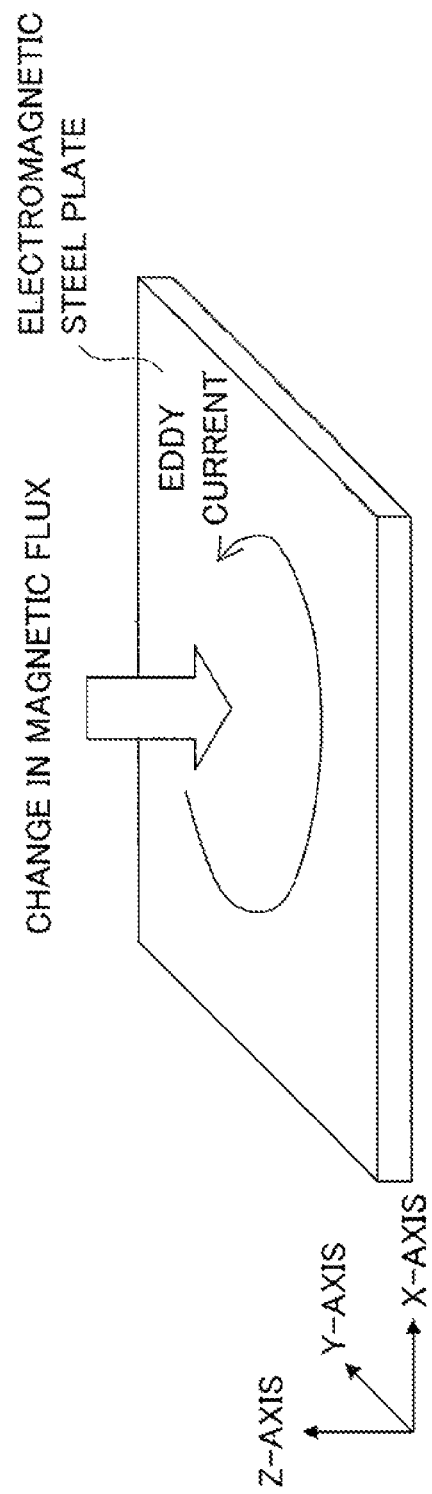
FIG. 8 is a diagram for explaining an eddy current that is generated when a magnetic flux perpendicular to an electromagnetic steel plate surface changes.
Figure 9:
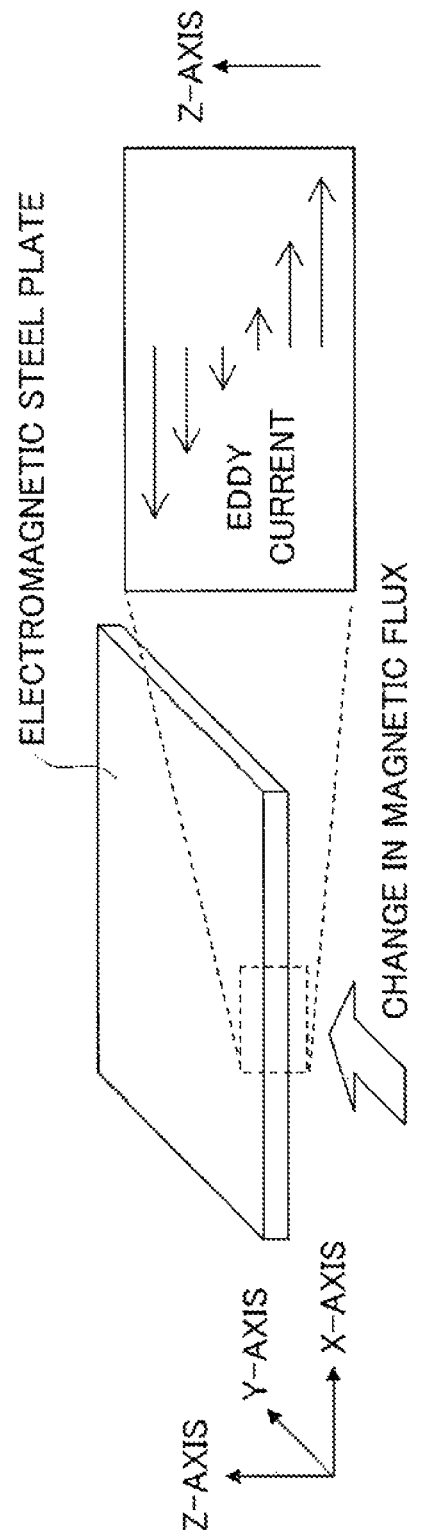
FIG. 9 is a diagram for explaining the eddy current that is generated when a magnetic flux parallel to the electromagnetic steel plate surface changes.

There exist two types of eddy currents that flow in a flat plate-shaped electromagnetic steel plate that is an example of the magnetic material, that is, the analyzing target, to be subjected to the magnetic property analysis. One type of eddy current is generated when the magnetic flux perpendicular to an electromagnetic steel plate surface (that is, the planar surface of the electromagnetic steel plate) changes, and this first type of eddy current does not have a distribution in a direction along the thickness of the electromagnetic steel plate (or plate thickness). FIG. 8 is a diagram for explaining the eddy current that is generated when the magnetic flux perpendicular to the electromagnetic steel plate surface changes. The other type of eddy current is generated when the magnetic flux parallel to the electromagnetic steel plate surface changes, and this second type of eddy current has a distribution in the direction along the plate thickness. FIG. 9 is a diagram for explaining the eddy current that is generated when the magnetic flux parallel to the electromagnetic steel plate surface changes.

As will be described later, according to the magnetic property analysis using the LLG equation, the accuracy may improve and the convergence may be reached more quickly as the elements obtained by the meshing become closer to a cube, and the accuracy may deteriorate and the convergence may be delayed as the elements obtained by the meshing become closer to a flat plate-shape. For this reason, it may be advantageous from the point of view of improving the accuracy and increasing the convergence, not to perform the meshing in the direction along the plate thickness (or to reduce the number of meshes or, the segmenting number) when the magnetic material that is the analyzing target has the flat plate-shape.

Figure 10:
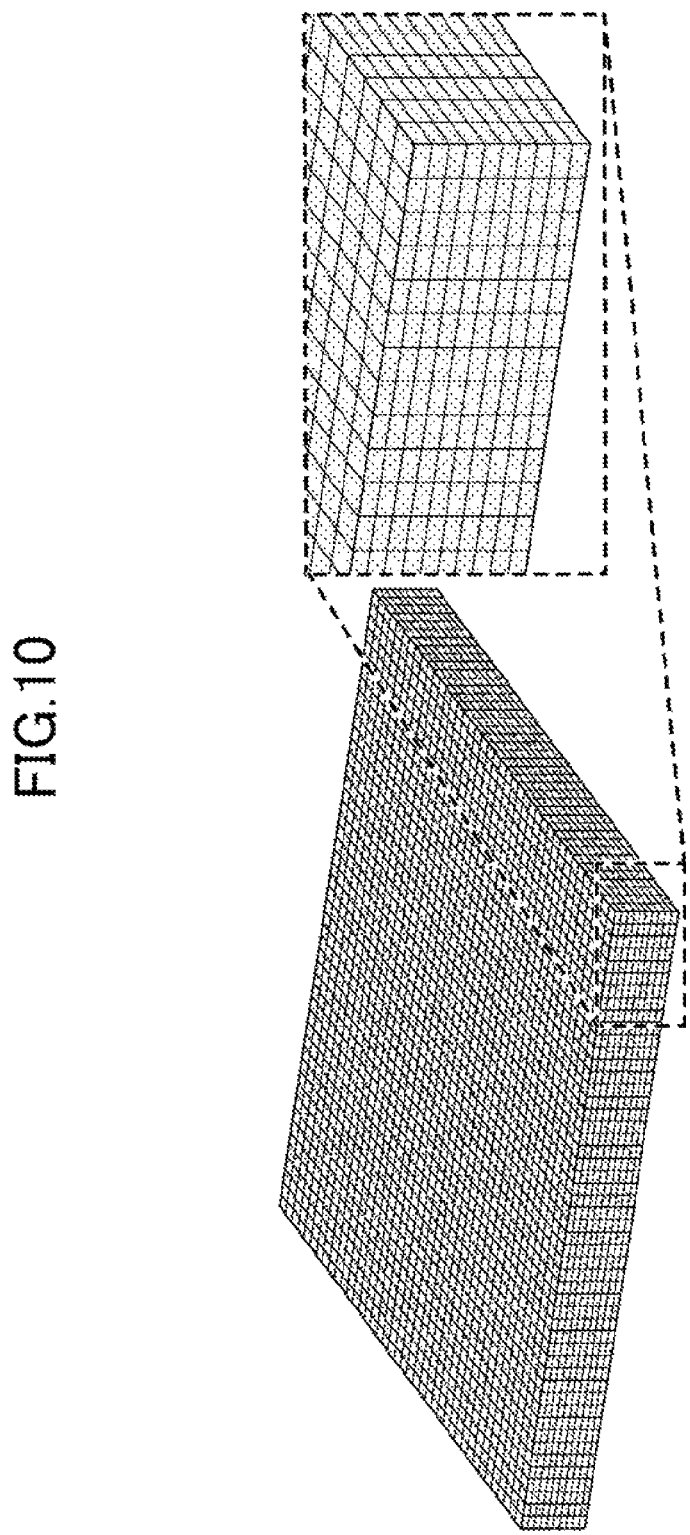
FIG. 10 is a diagram illustrating a state in which a magnetic material is segmented into meshes according to a length of an element in a direction along a plate thickness.

However, in order to reproduce the effects of the eddy current that is generated when the magnetic flux parallel to the electromagnetic steel plate surface changes, by the analysis utilizing the FEM, the number of meshes formed by the meshing (or segmenting) would need to be increased in the direction along the plate thickness. Consequently, in order to make the element obtained by the meshing (or segmenting) closer to the cube, the length in other directions would need to be made shorter in accordance with the length of the element along the plate thickness. As a result, the magnetic material would need to be segmented into small meshes. FIG. 10 is a diagram illustrating a state in which the magnetic material is segmented into meshes according to the length of the element in the direction along the plate thickness.

When the segmenting is performed to obtain the small meshes as illustrated in FIG. 10, the processing speed of the apparatus inevitably decreases. Hence, in the magnetic property analyzing apparatus 1 in this embodiment, the homogenization method is applied to the FEM, and the magnetic field analysis is performed by setting sub-grids within the element. In addition, an average magnetization is obtained with respect to sub-elements defined by the sub-grids, and an average magnetization is obtained with respect to each element (macro element) by averaging the average magnetizations of the sub-elements.

Figure 11:
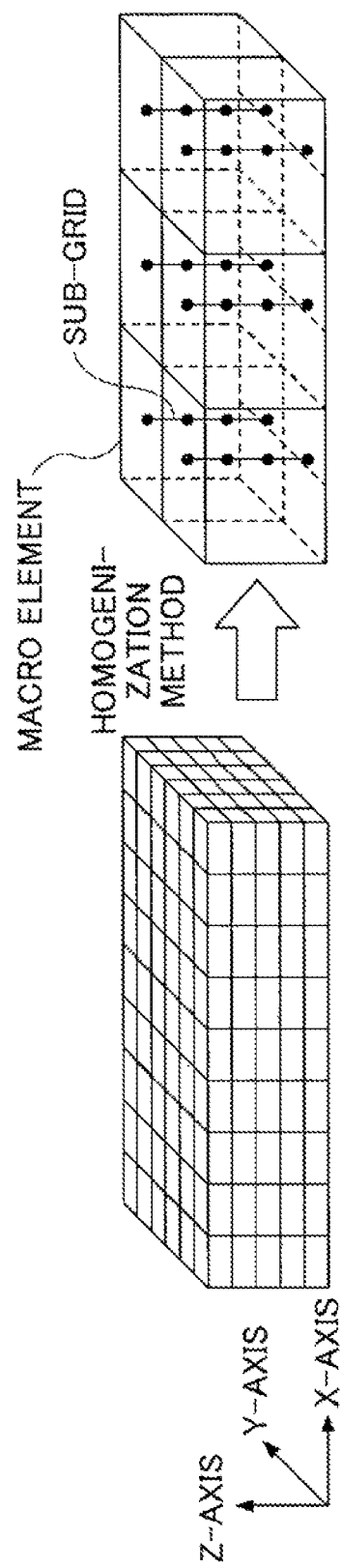
FIG. 11 is a diagram comparing an analyzing target subjected to a conventional meshing and an analyzing target subjected to a meshing applied with the homogenization method.
Figure 12:
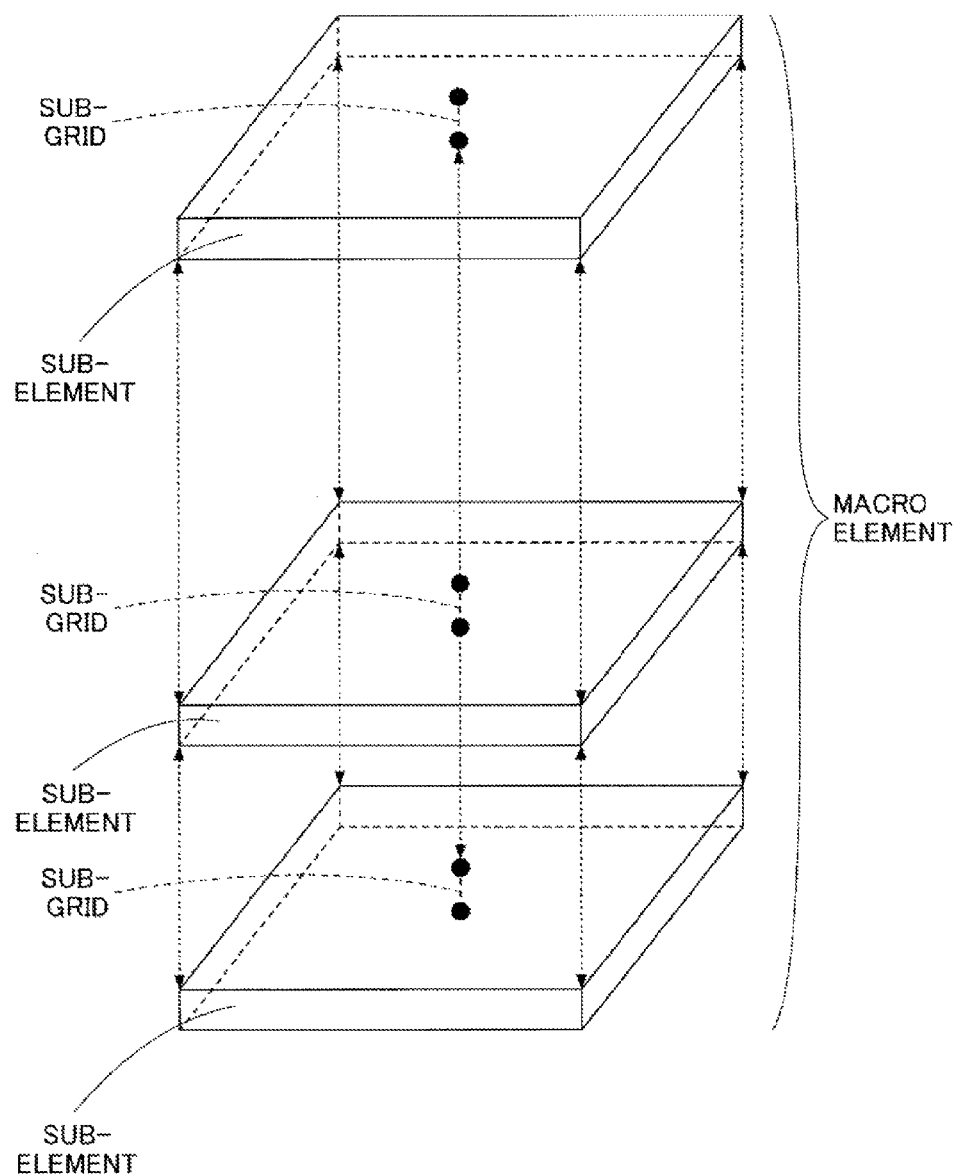
FIG. 12 is a disassembled perspective view illustrating a relationship of a macro element, sub-grids, and sub-elements.

FIG. 11 is a diagram comparing an analyzing target, illustrated on the left side, subjected to a conventional meshing and an analyzing target, illustrated on the right side, subjected to a meshing applied with the homogenization method. According to the analyzing target applied with the homogenization method, the sub-grids, that are one-dimensional line segments arranged in the direction along the plate thickness (Z-axis direction in FIG. 11) of the analyzing target, are set within the macro element that is segmented into the meshes by the conventional meshing. The sub-grid is a line segment that is cut out for every predetermined length, for example, on a line extending from one end to the other end of the element along the Z-axis direction. In addition, a plurality of regions, including the sub-grids and obtained by segmenting the macro element along the Z-axis direction, exist within the element. In the following description, such regions will be referred to as sub-elements. FIG. 12 is a disassembled perspective view illustrating a relationship of the macro element, the sub-grids, and the sub-elements.

According to the homogenization method, an equation of the magnetic field having two in-plane components with respect to one-dimension in the direction of the plate thickness is solved using the sub-grids. The magnetic field analysis using the homogenization method may couple the magnetic field analysis with respect to the macro element and the one-dimensional magnetic field analysis of the sub-grids, and obtain the solution by converging the coupled analysis result.

Figure 13:
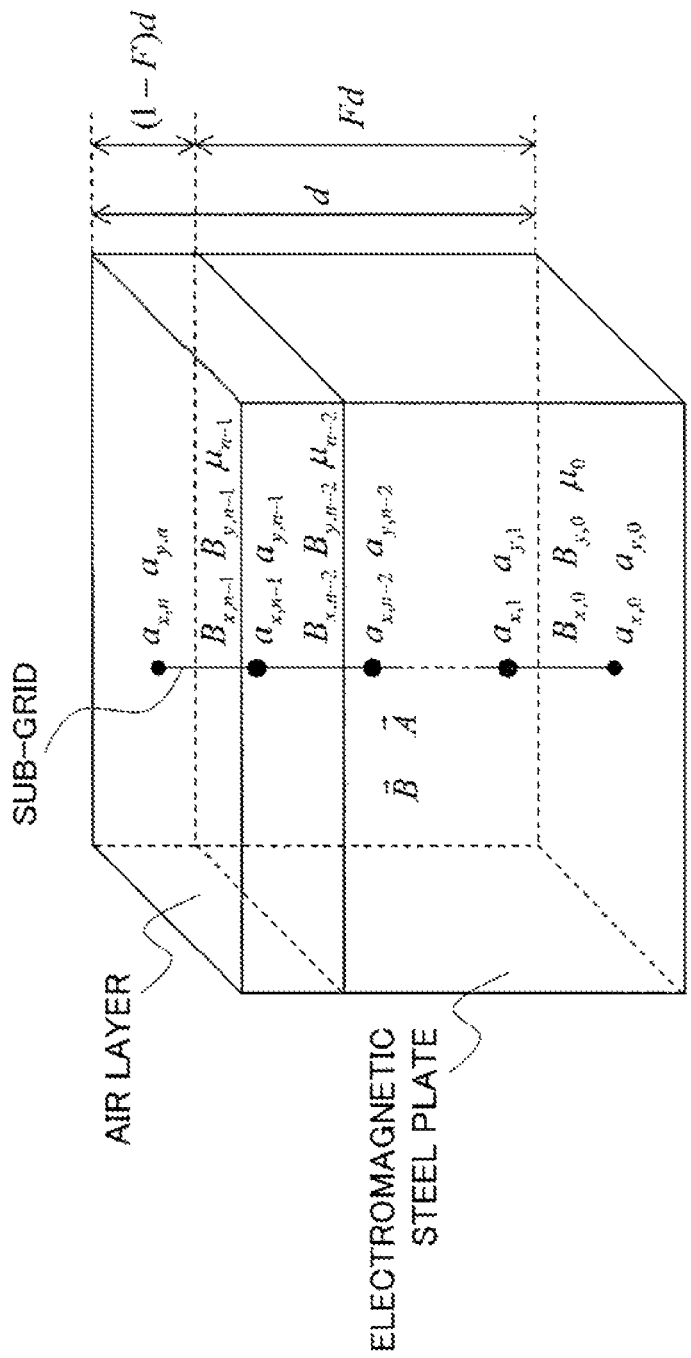
FIG. 13 is a diagram for explaining a method of arranging parameters in one element applied with the homogenization method.

The general homogenization method performs the analysis by supplying the magnetic field information (vector potential) from the analysis result of the macro element to each of the sub-grids, and obtains the entire magnetization distribution by supplying the material information (magnetic permeability, magnetization, conductivity, etc.) from each of the sub-grids. FIG. 13 is a diagram for explaining a method of arranging parameters in one element applied with the homogenization method.

As illustrated in FIG. 13, according to the homogenization method, a vector potential "a" (a vector potential of a sub-grid is denoted by a small letter) is arranged at each sub-grid, and a magnetic flux density B and a magnetic permeability $\mu$ are arranged at the sub-element. A vertical line penetrating each sub-element in the direction along the plate thickness corresponds to a one-dimensional space (straight line) in which the sub-grids are arranged. The homogenization method uses a vector potential A obtained by interpolating a value of a side or node to a sub-element center, and the magnetic flux density B arranged at the sub-element center, in order to compute the vector potential value at a center between upper and lower surfaces of the sub-element (both ends of the sub-grid) according to the following equations (28) through (31). In addition, the homogenization method uses the vector potential values as boundary values of the sub-grids, in order to solve the magnetic field equation by regarding the vector potentials corresponding to a X-component and a Y-component as unknowns. The following equations (32) and 33) represent the magnetic field equations to be solved with respect to the sub-grids.

$$a_{x,0} = A_x - \frac{d}{2}B_y \tag{28}$$

$$a_{y,0} = A_y + \frac{d}{2}B_x \tag{29}$$

$$a_{x,n} = A_x + \frac{d}{2}B_y \tag{30}$$

$$a_{y,n} = A_y - \frac{d}{2}B_x \tag{31}$$

$$\sigma\frac{\partial a_x}{\partial t} - \frac{\partial}{\partial z}\frac{1}{\mu}\frac{\partial a_x}{\partial z} = 0 \tag{32}$$

$$\sigma\frac{\partial a_y}{\partial t} - \frac{\partial}{\partial z}\frac{1}{\mu}\frac{\partial a_y}{\partial z} = 0 \tag{33}$$

The magnetic permeability to be supplied from the magnetic field analysis of the sub-grids to the magnetic field analysis of the macro element may be represented by the following equations (34) and (35). The magnetic permeability obtained from the equation (34) corresponds to the in-plane component of the magnetic permeability of the electromagnetic steel plate, and the magnetic permeability obtained from the equation (35) corresponds to the perpendicular component of the magnetic permeability perpendicular to the electromagnetic steel plate surface. The denominator of the equation (34) represents the boundary between the sub-grid and the air layer, and the numerator of the equation (34) represents the magnetic flux density obtained by the magnetic field analysis of the macro element. In addition, $l_i$ in the equation (35) represents an ith mesh width in the sub-grids, and $\mu_i$ represents an ith magnetic permeability of in the sub-grids.

$$\mu_{//} = \frac{\sqrt{B_x^2 + B_y^2}}{\sqrt{H_{x,air}^2 + H_{y,air}^2}} \tag{34}$$

$$\mu_\perp = \frac{d}{\sum_{i=1}^{n-1} l_i/\mu_i} \tag{35}$$

Figure 14:
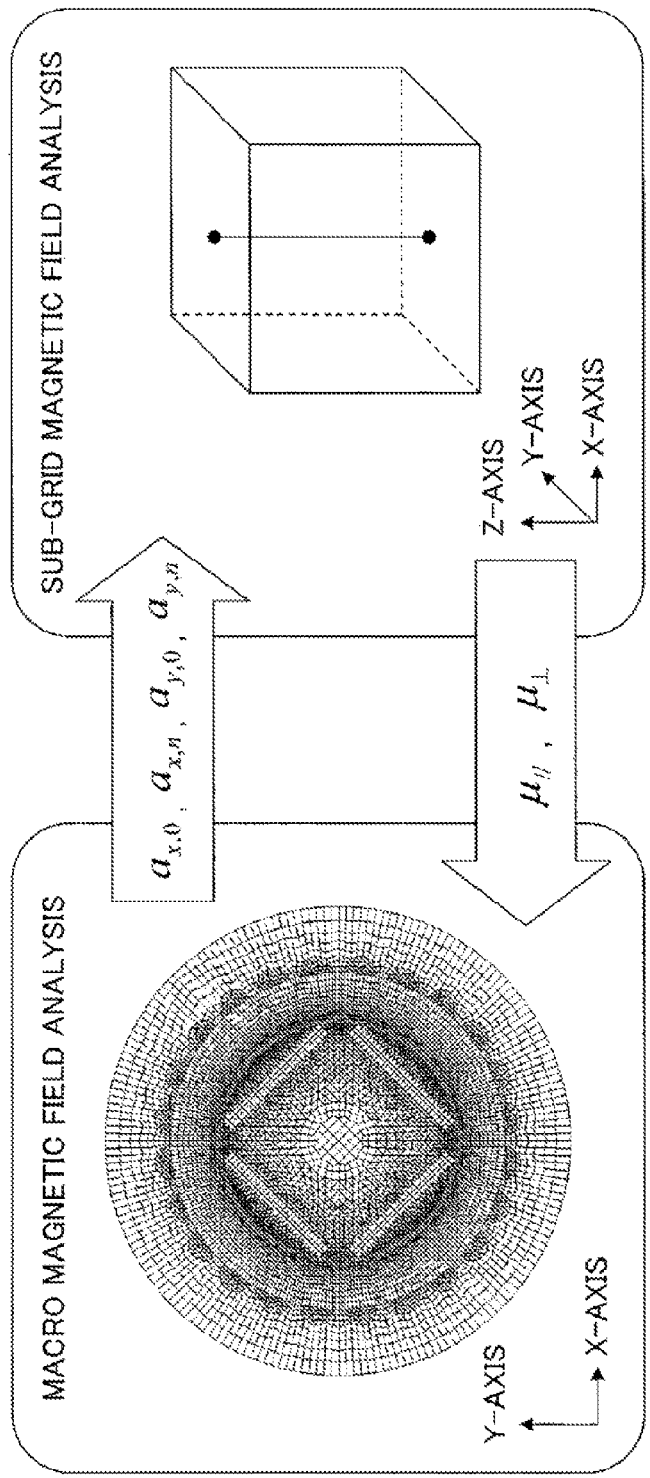
FIG. 14 is a diagram for explaining a convergent calculation sharing variables between a macro magnetic field analysis with respect to a conventional element and a one-dimensional magnetic field analysis in the sub-grids of all meshes forming the electromagnetic steel plate.

FIG. 14 is a diagram for explaining a convergent calculation sharing variables between the macro magnetic field analysis with respect to a conventional element and the one-dimensional magnetic field analysis in the sub-grids of all meshes forming the electromagnetic steel plate. The homogenization method may reproduce the eddy current within one mesh because the homogenization method may take into consideration the distribution of the in-plane magnetic field components along the direction of the plate thickness in the sub-grids.

By applying the homogenization method, it becomes possible to take into consideration the eddy current distribution in the direction along the plate thickness, even when the number of meshes in the direction along the plate thickness is small or the number is one. As a result, the processing time of the magnetic property analysis may be reduced when analyzing the analyzing target having the electromagnetic steel plate, such as the motor, and the like.

According to the technique utilizing the homogenization method, the magnetic material is represented using the magnetic permeability. For this reason, it may be difficult to reproduce a B-H curve that takes hysteresis into consideration.

Hence, in the magnetic property analyzing apparatus 1 in this embodiment, the coupled analysis is performed by supplying the magnetization vectors from the sub-grids obtained by the homogenization method to the macro element analysis, and then the integration of LLG equation is performed.

The following equation (36) represents a magnetization vector average value $<\rightarrow M>$ of the micromagnetics. On the other hand, the magnetization vector average value for the element applied with the homogenization method may be represented by the following equation (37). In the following equations (36) and (37), N denotes the number of samples of the magnetization vectors M used to represent the magnetic material by the statistical average, and Nsub denotes the number of sub-elements.

$$\langle \vec{M} \rangle_j = \frac{1}{N} \sum_{i=1}^{N} \vec{M}_{i,j} \quad (36)$$

$$\langle\langle \vec{M} \rangle\rangle = \frac{1}{Nsub} \sum_{j=1}^{Nsub} \langle \vec{M} \rangle_j = \frac{1}{N \cdot Nsub} \sum_{j=1}^{Nsub} \sum_{i=1}^{N} \vec{M}_{i,j} \quad (37)$$

Figure 15:
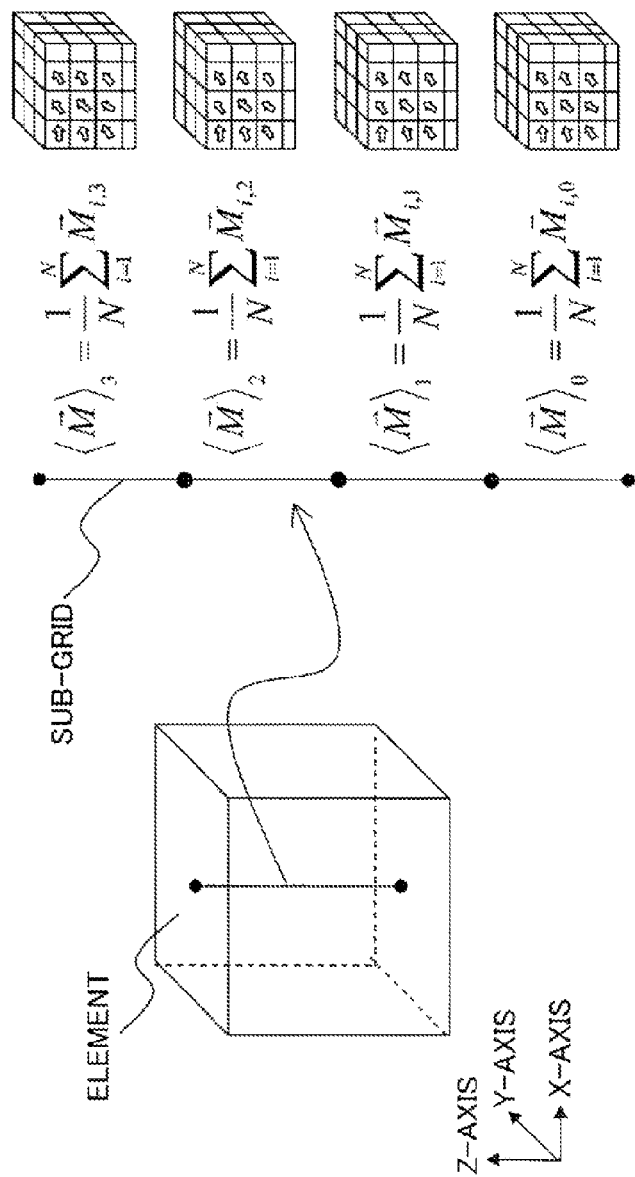
FIG. 15 is a diagram for explaining an allocation method for the magnetization vector →$M_i$ in the sub-elements defined by the sub-grids according to the homogenization method.

FIG. 15 is a diagram for explaining an allocation method for the magnetization vector $\rightarrow M_i$ in the sub-elements defined by the sub-grids according to the homogenization method. In the magnetic property analyzing apparatus 1 in this embodiment, a plurality of magnetization vectors $\rightarrow M$ are arranged at the sub-elements (sub elements 0, 1, 2, and 3 in FIG. 15) within the macro element, and the average value $<\rightarrow M>$ of the magnetization vectors $\rightarrow M$ within each sub-element is defined as the average magnetization (hereinafter also referred to as a sub average magnetization) of each sub-element. Furthermore, in the magnetic property analyzing apparatus 1 in this embodiment, an average value $<<\rightarrow M>>$ of the sub average magnetizations $<\rightarrow M>$ of each of the sub-elements within the macro element is defined as a macro average magnetization.

[Operation]

Figure 16:
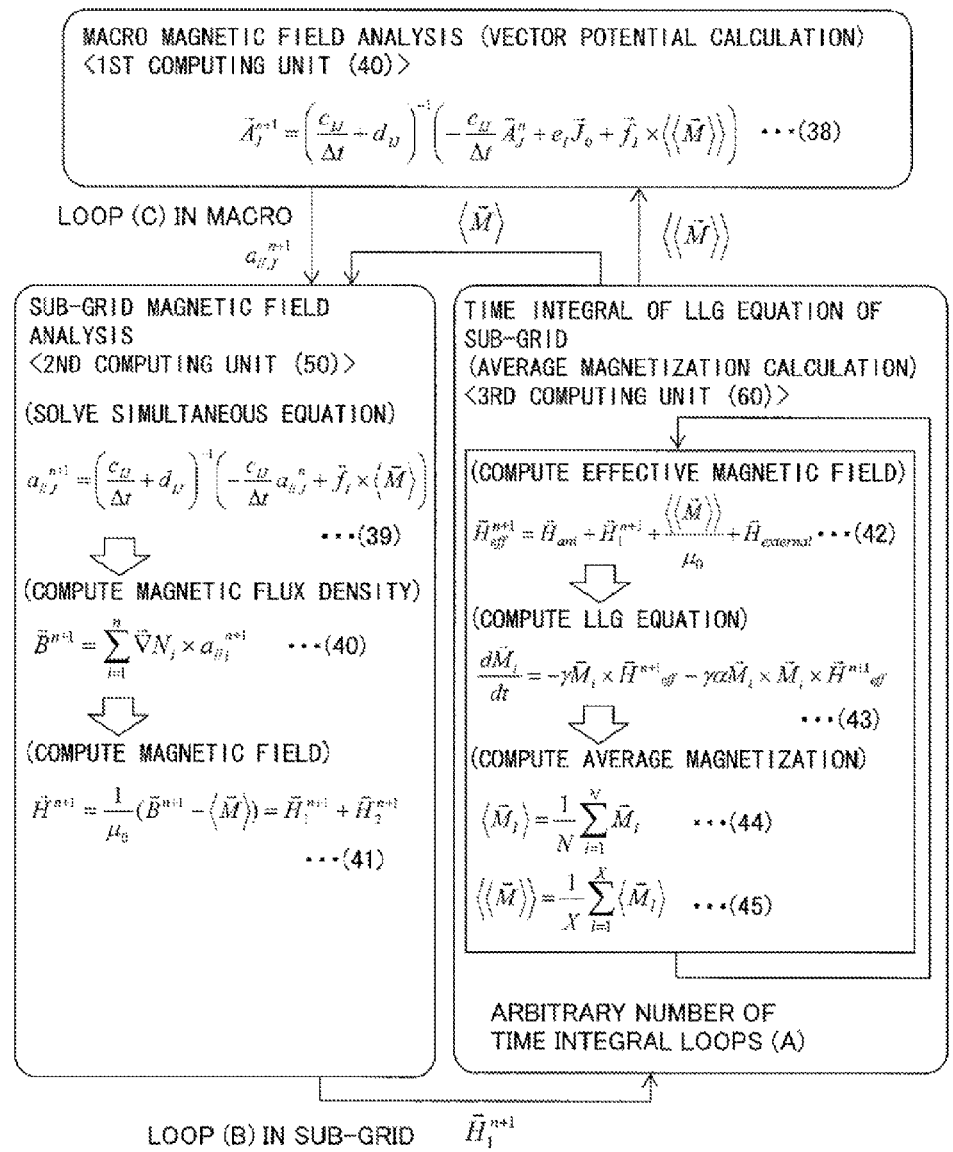
FIG. 16 is a diagram schematically illustrating a process executed by a first computing unit, a second computing unit, and a third computing unit.

FIG. 16 is a diagram schematically illustrating a process executed by the first computing unit 40, the second computing unit 50, and the third computing unit 60. In addition, FIG. 17 is a flow chart for explaining a process executed by the control unit 70.

Figure 17:
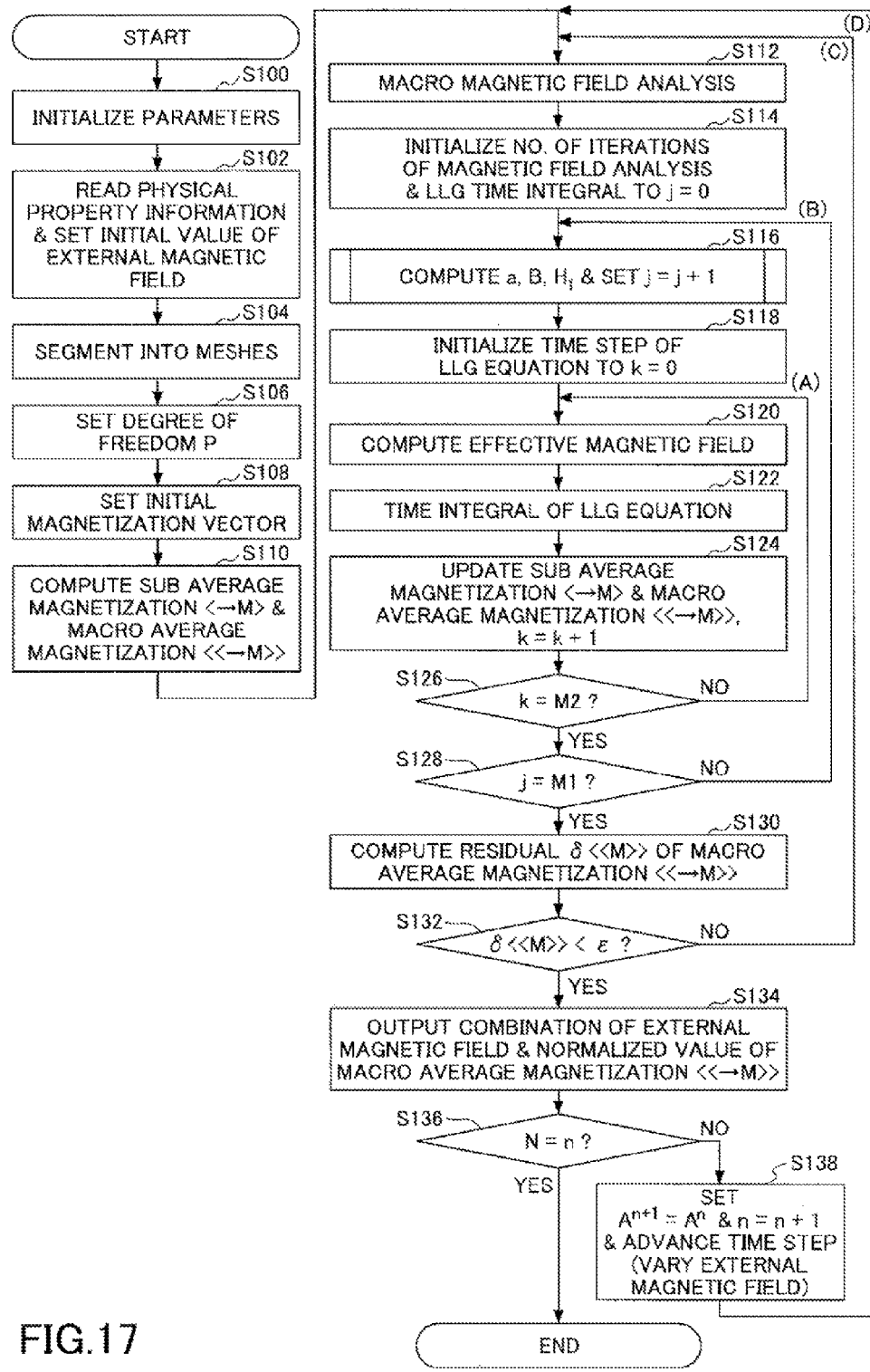
FIG. 17 is a flow chart for explaining a process executed by a control unit.

As illustrated in FIG. 17, the control unit 70 initializes the parameters (step S100). The initializing of the parameters may include specifying the number N of transient computation steps to compute the magnetic field, the number M1 of iterations of the sub-grid magnetic field analysis and the LLG time integral, and the LLG loop number M2, setting the convergence judging threshold value $\epsilon$, initializing a time-step n of the magnetic field equation, and the like. The control unit 70 may read the value accepted by the setting input accepting unit 30, the default value stored in the auxiliary storage unit 16, and the like, and extract (or unarchive) the read value in the memory unit 18.

Next, the control unit 70 sets the physical property information, and sets the initial value of the external magnetic field $\rightarrow H_{external}$ (step S102). The physical property information and the external magnetic field $\rightarrow H_{external}$ may be a value accepted by the setting input accepting unit 30, a default value stored in the auxiliary storage unit 16, and the like, and the control unit 70 may extract (or unarchive) the read value in the memory unit 18.

Further, the control unit 70 sets a plurality of elements and a plurality of sub-elements by segmenting the analyzing target into the meshes utilizing the FEM (step S104).

Next, the control unit 70 sets the degree of freedom P (number of internal structures computing the magnetization vector $\rightarrow M_i$ within each sub-element) to be used for the computation of the LLG equation by the third computing unit 60 (step S106).

In addition, the control unit 70 sets the initial magnetization vector at random, for example, with respect to the internal structure within each of the sub-elements (step S108). The control unit 70 computes the sub average magnetization $<\rightarrow M>$ and the macro average magnetization $<<\rightarrow M>>$, based on the set magnetization vector (step S110). The process of the steps S106 through S110 may be executed by the third computing unit 60.

When the setting of the processing state ends, the control unit 70 controls the first computing unit 40 to perform the macro magnetic field analysis (step S112). First, the first computing unit 40 substitutes the macro average magnetization $<<\rightarrow M>>$ computed in the step S110 or a step S124 to be described later, into an equation (38) illustrated in FIG. 16, in order to compute a vector potential $\rightarrow A_j^{n+1}$.

Next, the control unit 70 initializes a number j of iterations of the sub-grid magnetic field analysis and the LLG time integral (step S114). Then, the control unit 70 controls the second computing unit 50 to solve the simultaneous equations of the sub-grid magnetic field analysis in order to compute the vector potential "a", the magnetic flux density B, and a magnetic field H1, and to increment the number j of iterations by one (step S116).

The second computing unit 50 computes an in-plane component (component within a plane perpendicular to the direction of the sub-grids) $a//j^{n+1}$ of the vector potential according to an equation (39) illustrated in FIG. 16, using the vector potential $A_j^{n+1}$ computed by the first computing unit 40. Next, the second computing unit 50 computes a magnetic flux density $\rightarrow B^{n+1}$ from an equation (40) illustrated in FIG. 16 based on the in-plane component $a//j^{n+1}$ of the vector potential. Further, the second computing unit 50 computes a magnetic field $\rightarrow H^{n+1}$ based on an equation (41) illustrated in FIG. 16, using the magnetic flux density $\rightarrow B^{n+1}$. The magnetic field $\rightarrow H^{n+1}$ may be decomposed into a component $\rightarrow H_1^{n+1}$ that is obtained by dividing the magnetic flux density $\rightarrow B^{n+1}$ by the space permeability $\mu_0$, and a component $\rightarrow H_2^{n+1}$ that is obtained by dividing a value equal to but having a sign opposite to that of the average magnetization $<\rightarrow M>$ by the space permeability $\mu_0$. The second computing unit 50 may output the component $\rightarrow H_1^{n+1}$, that is obtained by dividing the magnetic flux density $\rightarrow B^{n+1}$ by the space permeability $\mu_0$, to the third computing unit 60.

Next, the control unit 70 initializes the time-step k of the LLG equation to k=0 (step S118), and control the third computing unit 60 to execute the following process. That is, the third computing unit 60 computes the effective magnetic field according to an equation (42) illustrated in FIG. 16 (step S120). In this example, the third computing unit 60 may use the value computed by the second computing unit 50 in the step S116, as a fixed value for the term $\rightarrow H_1^{n+1}$ in the equation (42). However, the value updated in the step S124 may be recursively reflected on the other component $<\rightarrow M>/\mu_0$.

Next, the third computing unit 60 sets the LLG equation represented by an equation (43) illustrated in FIG. 16 for the internal structures of each of the sub-elements, and computes the magnetization vector $\vec{M}_i$ from the time integral of the LLG equation (step S122).

Moreover, the third computing unit 60 obtains and updates the sub average magnetization $<\vec{M}>$ according to an equation (44) illustrated in FIG. 16, obtains and updates the macro average magnetization $<<\vec{M}>>$ according to an equation (45) illustrated in FIG. 16, for each of the sub-elements, in order to increment the time-step k of the LLG equation by one (step S124). In the equations (44) and (45), l denotes an identifier of the sub-element, and X denotes the number of sub-elements within one macro element.

Next, the third computing unit 60 judges whether the time-step k of the LLG equation is equal to the LLG loop number M2 (step S126). For example, the LLG loop number M2 may be set to a value on the order of several tens to several hundred.

When the time-step k of the LLG equation is not equal to the LLG loop number M2, the third computing unit 60 returns the process to the step S120 in order to execute a loop (A).

When the time-step k of the LLG equation is equal to the LLG loop number M2, the process of the third computing unit 60 temporarily ends, and the control unit 70 judges whether the number j of iterations of the sub-grid magnetic field analysis and the LLG time integral is equal to the number M1 of iterations (step S128). For example, the number M1 of iterations is set to a value on the order of several to several tens.

When the number j of iterations is not equal to the number M1 of iterations, the process returns to the step S116 and executes the process of the second computing unit 50 in order to execute a loop (B).

When the number j of iterations is equal to the number M1 of iterations M1, the control unit 70 computes a residual $\delta<<M>>$ of the macro average magnetization $<<\vec{M}>>$ (step S130). The residual $\delta<<M>>$ may be an index value that is obtained by subtracting the macro average magnetization $<<\vec{M}>>$ finally computed by the process of the steps S112 through S122 that are previously executed, from the macro average magnetization $<<\vec{M}>>$ finally computed by the process of the steps S112 through S122 that are currently executed after the previous execution. For example, the residual $\delta<<M>>$ may be a difference of average values $<<<\vec{M}>>>$ of the macro average magnetizations $<<\vec{M}>>$ computed for each of the elements. Furthermore, the residual $\delta<<M>>$ is not limited to the above, and may be a set of the differences of the macro average magnetizations $<<\vec{M}>>$ computed for each of the elements.

The residual $\delta<<M>>$ may be computed from the following equations (46) through (48), for example. The residual $\delta<<M>>$ may be computed from the equation (48) with a highest accuracy when compared to the equations (46) and (47), however, the processing load of the equation (48) is larger when compared to the equations (46) and (47). For this reason, the magnetic property analyzing apparatus 1 may switch the equation to be used for computing the residual $\delta<<M>>$, from amongst the equations (46) through (48), depending on the accuracy required of the analysis, the user settings, and the like.

$$\delta\langle\langle M\rangle\rangle = |\langle\langle M\rangle\rangle^{n+1} - \langle\langle M\rangle\rangle^{n}| \tag{46}$$

$$\delta\langle\langle M\rangle\rangle = \frac{1}{N}\sum_{i=1}^{N}|\langle M\rangle_i^{n+1} - \langle M\rangle_i^{n}| \tag{47}$$

$$\delta\langle\langle\vec{M}\rangle\rangle = \frac{1}{N \cdot Nsub}\sum_{j=1}^{Nsub}\sum_{i=1}^{N}\left|\vec{M}_{i,j}^{n+1} - \vec{M}_{i,j}^{n}\right| \tag{48}$$

When the residual $\delta<<M>>$ is computed, the control unit 70 judges whether the computed residual $\delta<<M>>$ is less than the convergence judging threshold value $\epsilon$ (step S132). In the case in which the residual $\delta<<M>>$ is the difference of the average values $<<<\vec{M}>>>$ of the macro average magnetizations $<<\vec{M}>>$, the step S132 may judge whether the difference of average values $<<<\vec{M}>>>$ is less than the convergence judging threshold value $\epsilon$. In addition, in the case in which the set of the differences of the macro average magnetizations $<<\vec{M}>>$ computed for each of the elements, the step S132 may judge whether all of the differences in the set are less than the convergence judging threshold value $\epsilon$.

When the residual $\delta<<M>>$ is greater than or equal to the convergence judging threshold value $\epsilon$ in the step S132, the control unit 70 returns the process to the step S112 and performs the macro magnetic field analysis by the first computing unit 40 in order to execute a loop (C).

On the other hand, when the residual $\delta<<M>>$ is less than the convergence judging threshold value $\epsilon$ in the step S132, the control unit 70 may judge that the macro average magnetization $<<\vec{M}>>$ sufficiently converged with respect to the current external magnetic field $\vec{H}_{external}$. Hence, the control unit 70 may output the external magnetic field $\vec{H}_{external}$, and a normalized value of the macro average magnetization $<<\vec{M}>>$ (for example, a value averaged for each element), as parts of the analysis results (step S134) of the magnetic property analyzing apparatus 1. The analysis results may be stored in the memory unit 18, for example.

Next, the control unit 70 judges whether the time-step n of the magnetic field equation is equal to the number N of transient computation steps (step S136).

When the time-step n of the magnetic field equation is not equal to the number N of transient computation steps in the step S136, the control unit 70 advances the time-step by setting $A^{n+1}$ and n to $A^{n+1}=A^n$ and n=n+1, respectively (step S138). In this state, the control unit 70 may vary the external magnetic field $\vec{H}_{external}$ by a predetermined amount, based on an amount of change per unit time of the external magnetic field that is predetermined, and the like. Then, the control unit 70 returns the process to the step S112 and performs the macro magnetic field analysis by the first computing unit 40 in order to execute a loop (D).

Figure 18:
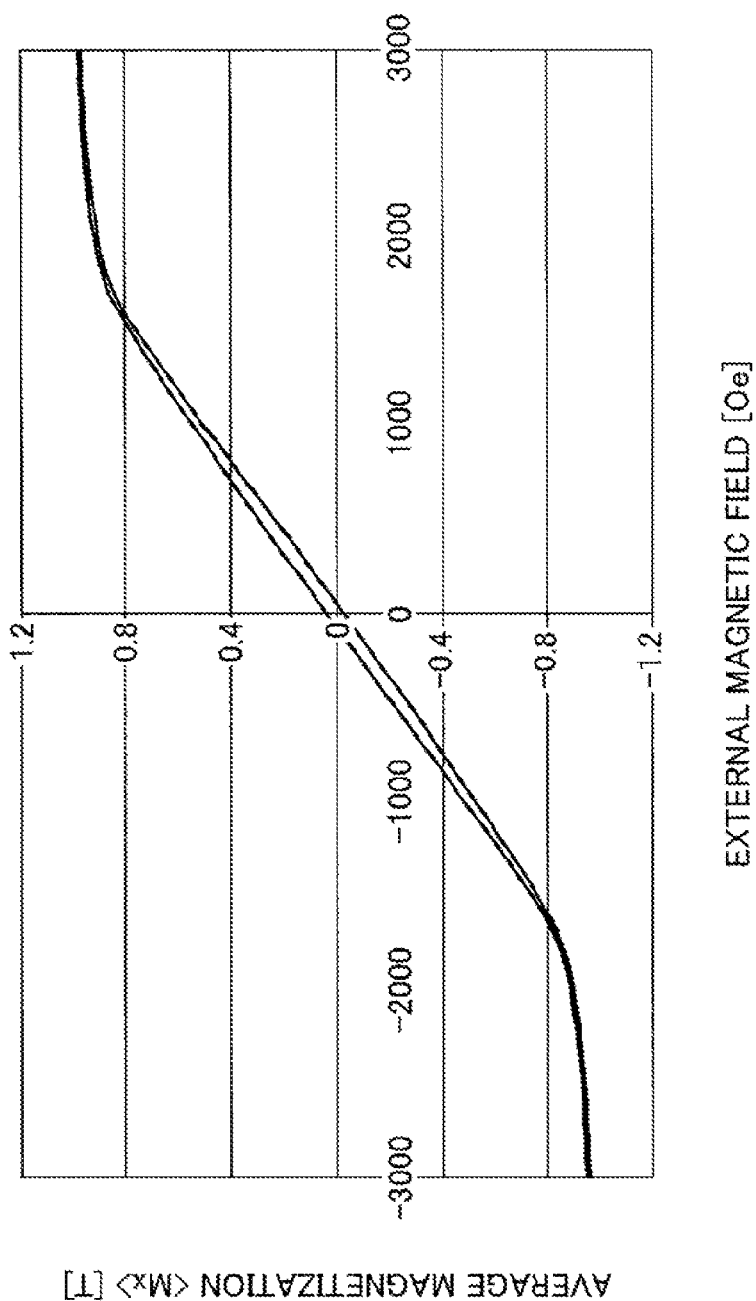
FIG. 18 is a diagram illustrating an example of a screen displayed on a display unit and displaying an analysis result of the magnetic property analyzing apparatus in the embodiment.

By repeatedly executing the process of the loop (D), a plurality of data formed by a combination of the external magnetic field $\vec{H}_{external}$, and the normalized value (for example, inter-element average) of the converged value of the macro average magnetization $<<\vec{M}>>$ when the external magnetic field $\vec{H}_{external}$ is applied, are output as parts of the analysis results of the magnetic property analyzing apparatus 1 in this embodiment. FIG. 18 is a diagram illustrating an example of a screen of the analysis results displayed on the display device 24 of the magnetic property analyzing apparatus 1 in this embodiment. As illustrated in FIG. 18, the analysis results of the magnetic property analyzing apparatus 1 include a B-H curve indicating a relationship between the external magnetic field and the average magnetization, for example.

When the time-step n of the magnetic field equation is equal to the number N of transient computation steps in the step S136, the control unit 70 ends the process illustrated in FIG. 17.

The extent to which the external magnetic field $\rightarrow H_{external}$ is varied in the step S138 may be preset so that one loop is executed by the time the time-step n of the magnetic field equation becomes equal to the number N of transient computation steps, for example.

The magnetic property analyzing apparatus 1 in this embodiment may shorten the convergence time of the macro average magnetization $<<\rightarrow M>>$ by the processes of the loops (A) through (C) described above, in order to improve the processing speed. The magnetic field component $H_1^{n+1}$ computed by the second computing unit 50 is caused by the magnetization distribution, the exciting current, the eddy current, and the like, and changes gradually when compared to the time in which the macro average magnetization $<<\rightarrow>>$ varies.

As a result, the magnetic field component $H_1^{n+1}$ undergoes a gradual change with time when compared to the magnetic field component $H_2^{n+1}$, and may be treated as being stationary with respect to the change of the magnetic field component $H_2^{n+1}$. On the other hand, the magnetic field component $H_2^{n+1}$ changes together with the macro average magnetization $<<\rightarrow M>>$ within the loop (A) related to the time extraction of the LLG equation, and greatly affects the shape of the B-H curve that may become at least a part of the analysis result.

In addition, because the simultaneous equations related to each of the elements obtained by the segmenting of the analyzing target are to be solved when performing the magnetic field analysis utilizing the FEM, the magnetic field analysis executed in the step S112 in FIG. 17 may require a longer processing time when compared to the time integral of the LLG equation executed in the step S122.

Therefore, in the loop (A), the magnetic field component $H_2^{n+1}$ proportional to the macro average magnetization $<<\rightarrow M>>$ may be varied while maintaining the magnetic field component $H_1^{n+1}$ fixed, in order to shorten the convergence time of the macro average magnetization $<<\rightarrow M>>$ in the loop (C).

Moreover, after the process of the step S112 is executed once, the process of the loops (A) and (B) may be executed a plurality of times, in order to reduce the number of times the magnetic field analysis utilizing the FEM and requiring a relatively long processing time is executed when compared to a case in which the process of the step S112 and the process of the loops (A) and (B) are alternately executed once each. Consequently, the magnetic property analysis may be performed at a high speed and with a high accuracy, by executing the process of the loops (A) and (B) a plurality of times after executing the process of the step S112 once.

Furthermore, according to the magnetic property analyzing apparatus 1 in this embodiment, the elements obtained by the segmenting (or meshing) is further segmented into sub-elements, and the magnetic field analysis is performed with respect to the sub-grids and the sub-elements. For this reason, the eddy current may be accurately reflected to the magnetic field analysis of the thin plate-shaped magnetic material, without introducing an excessively large number of elements.

Therefore, the magnetic properties may be analyzed at an even higher speed and with an even higher accuracy.

Comparison Between Embodiment and Conceivable Technique

Figure 19:
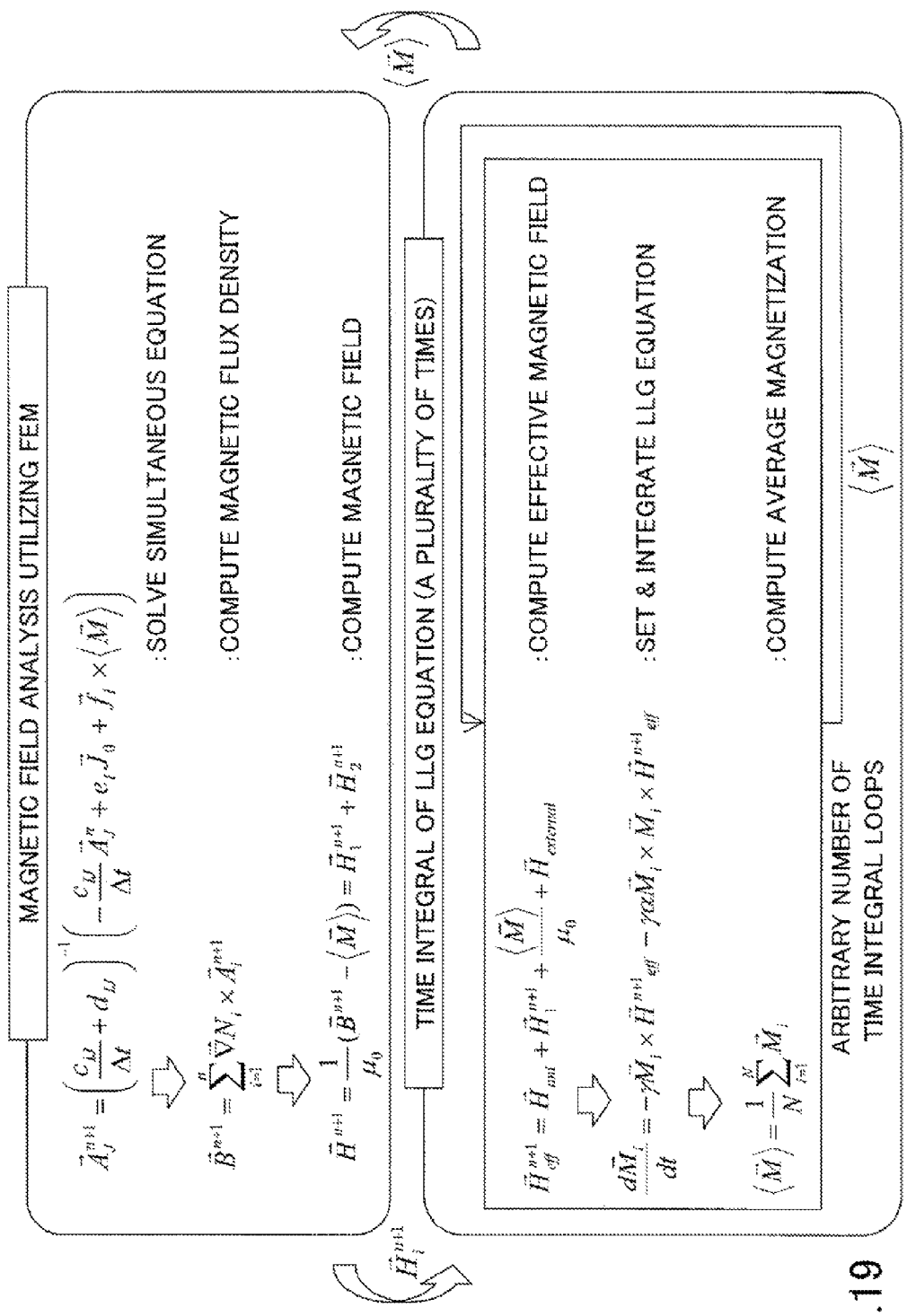
FIG. 19 is a diagram schematically illustrating a process executed by a conceivable technique.
Figure 20:
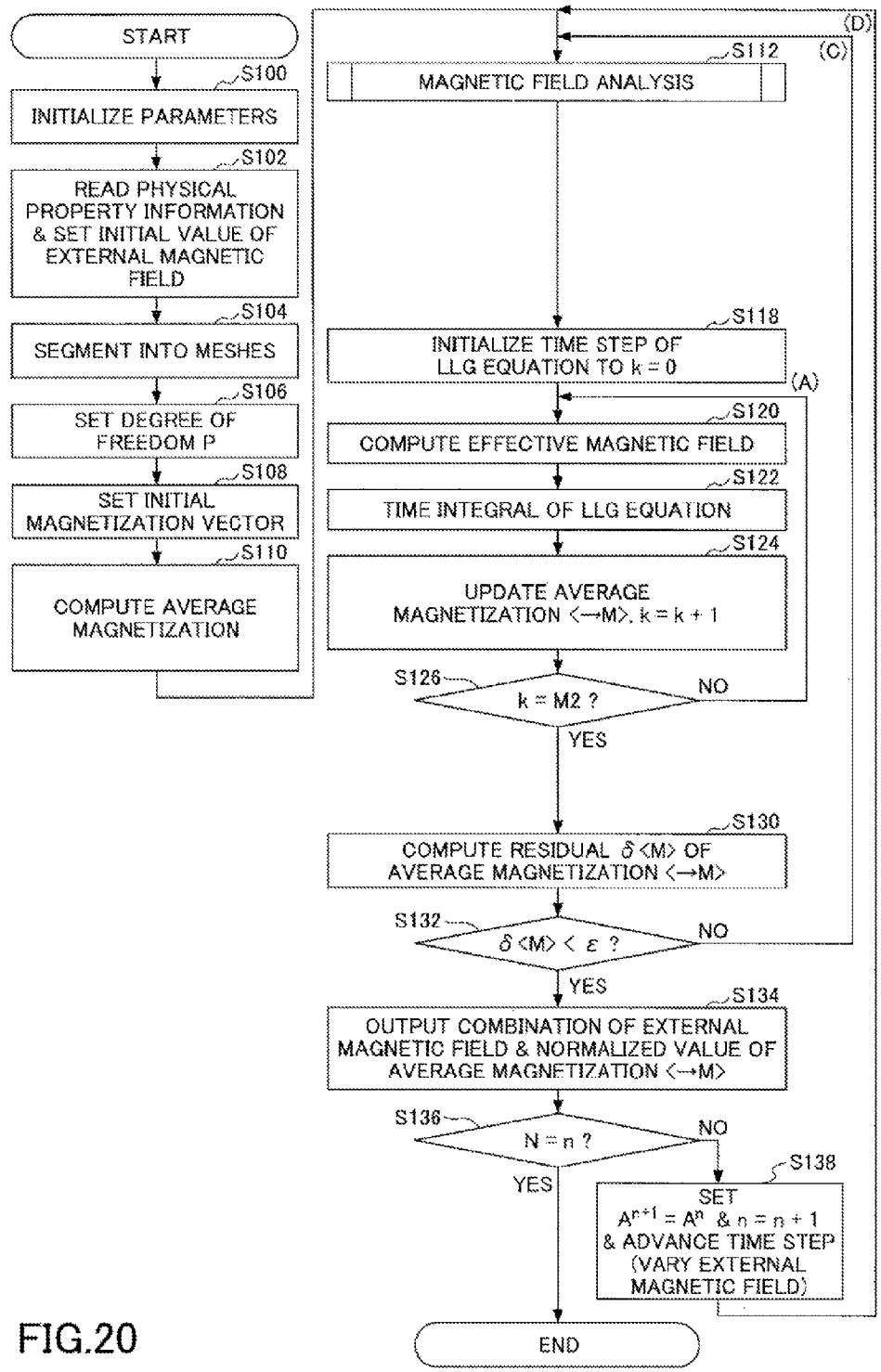
FIG. 20 is a flow chart for explaining the process executed by the conceivable technique.

Next, a description will be given of a comparison between the process (or technique) of the embodiment, and a conceivable technique which computes the magnetic field component $H_1^{n+1}$ by the macro magnetic field analysis utilizing the FEM, and integrates the LLG equation a plurality of times using the computed magnetic field component $H_1^{n+1}$ as a fixed value. FIG. 19 is a diagram schematically illustrating a process executed by a conceivable technique, and FIG. 20 is a flow chart for explaining the process executed by the conceivable technique. In FIG. 20, those steps that are similar to those corresponding steps in FIG. 17 are designated by the same reference numerals, and a description thereof will be omitted. When the process illustrated in FIG. 20 is compared with that of the embodiment illustrated in FIG. 17, the process of the steps S114, S116, and S128 is omitted and there is no loop (B) in FIG. 20. For this reason, the segmenting (or meshing) of the conceivable technique may require small meshes to be obtained in order to compensate for not setting the sub-grids of the embodiment.

The present inventor conducted simulations to analyze the magnetic properties according to both the technique of the embodiment and the conceivable technique. Because the conceivable technique does not set the sub-grids, the segmenting according to the conceivable technique is set to obtain sufficiently small meshes. It is assumed that the processed results of the embodiment matches the processed results of the conceivable technique, for the average magnetization $<\rightarrow M>$ in a case in which the average magnetization $<\rightarrow M>$ converges with respect to a given external magnetic field $\rightarrow H_{external}$.

Figure 21A:
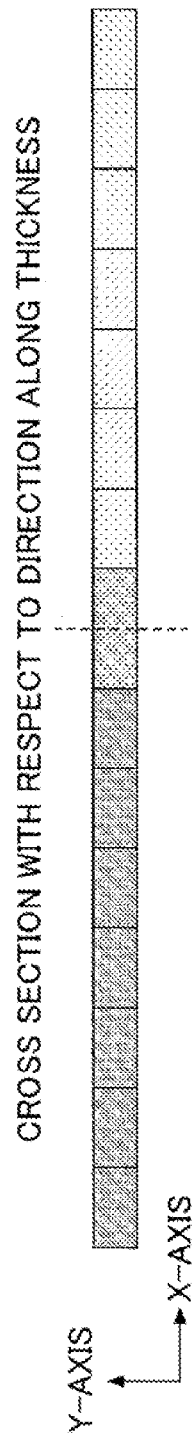
FIGS. 21A and 21B are diagrams for comparing mesh data used by the technique of the embodiment and mesh data used by the conceivable technique.
Figure 21B:
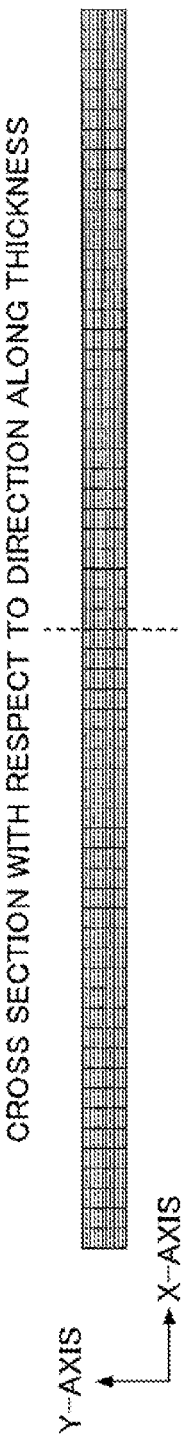

FIGS. 21A and 21B are diagrams for comparing mesh data used by the technique of the embodiment and mesh data used by the conceivable technique, respectively. The mesh data illustrated in FIGS. 21A and 21B are related to the plate-shaped magnetic material having the same size and shape. The mesh data used in the technique of the embodiment are not segmented into meshes in the direction along the plate thickness, however, the mesh data used in the conceivable technique are segmented into 32 meshes (or layers) in the direction along the plate thickness.

The following parameters are used for the simulations to analyze the magnetic properties. The amplitude (or magnitude) of the external magnetic field is set within a range in which the B-H characteristic of the magnetic material becomes linear.

Conductivity: 1.92E6 [/Ωm]
Magnetic Permeability: 500×$\mu_0$ [H/m]($\mu_0$=4π×$10^{-7}$)
Frequency of External Magnetic Field: 1000 [Hz] and 5000 [Hz]
Amplitude of External Magnetic Field: 5000 [A/m]
Direction of External Magnetic Field: X-Direction (Refer to FIGS. 8, 9 and 21)

Figure 22:
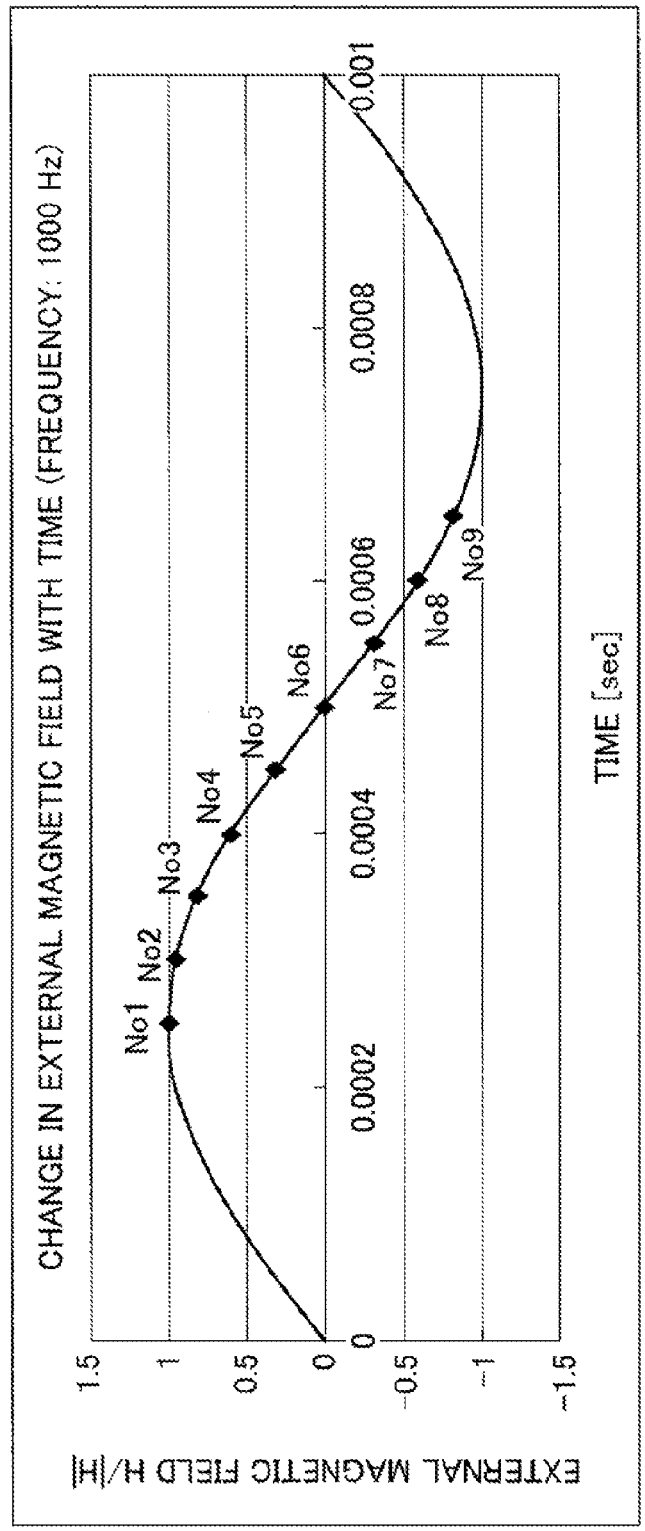
FIG. 22 is a diagram illustrating a change of the external magnetic field with time for a case in which the frequency of the external magnetic field is 1000 [Hz]
Figure 23:
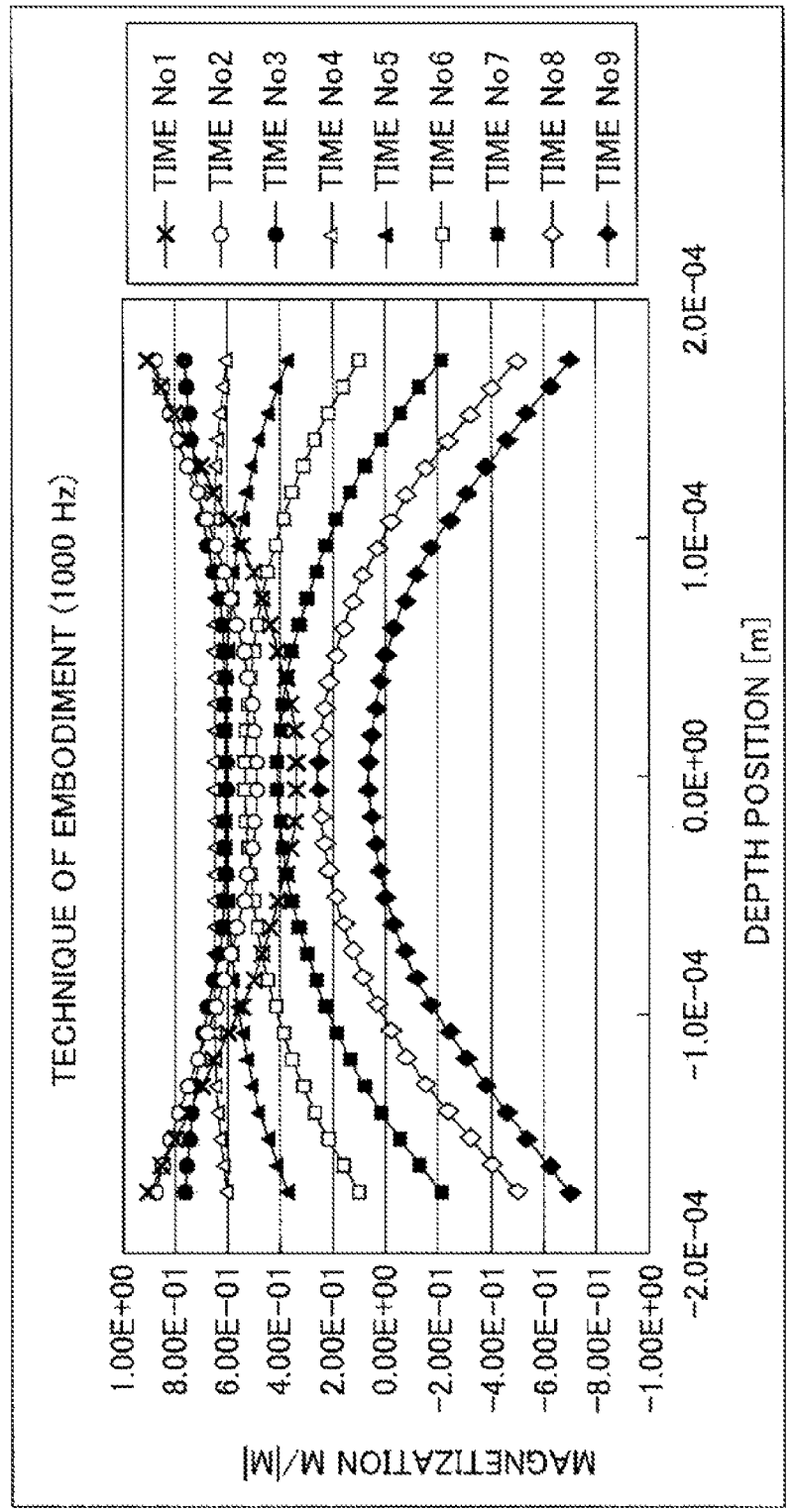
FIG. 23 is a diagram illustrating a simulation result for a case in which the external magnetic field illustrated in FIG. 22 is applied to the technique of the embodiment.
Figure 24:
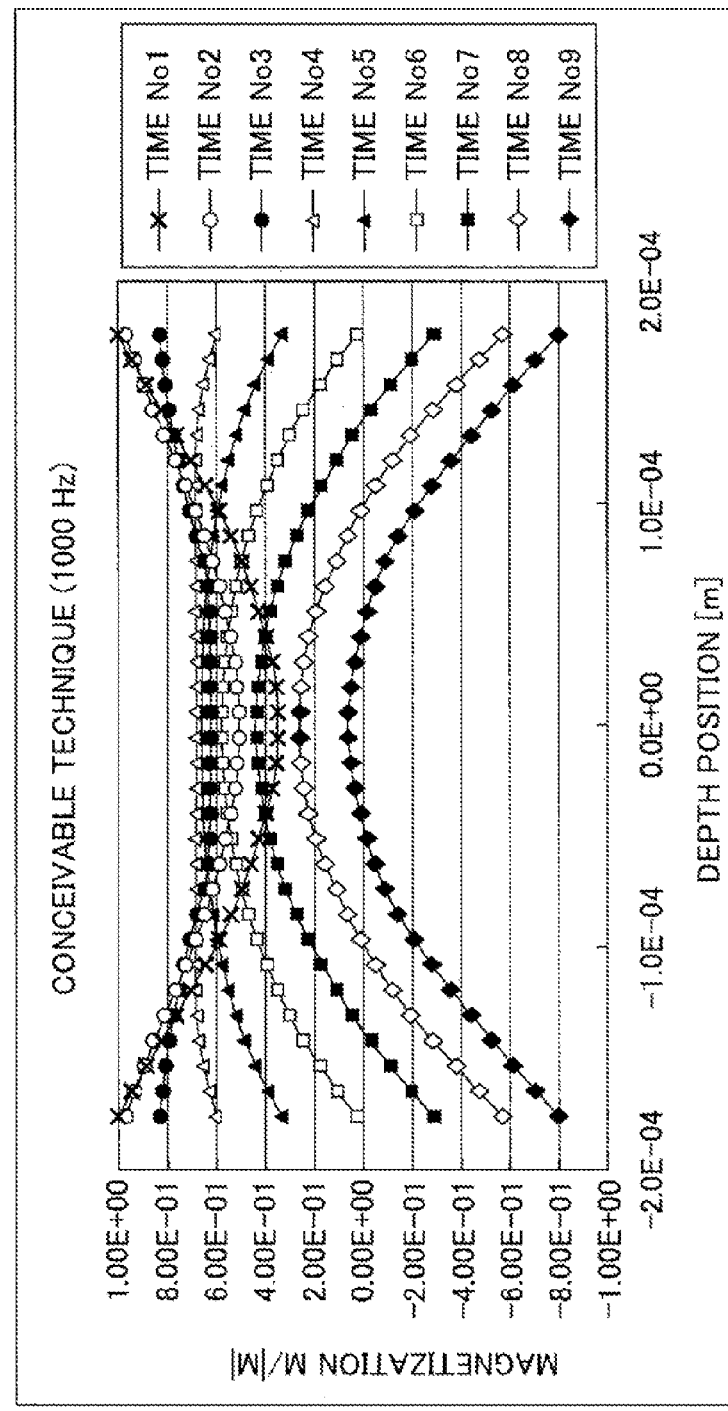
FIG. 24 is a diagram illustrating a simulation result for a case in which the external magnetic field illustrated in FIG. 22 is applied to the conceivable technique.

FIG. 22 is a diagram illustrating a change of the external magnetic field with time for a case in which the frequency of the external magnetic field is 1000 [Hz]. FIGS. 23 and 24 are diagrams illustrating simulation results for a case in which the external magnetic field illustrated in FIG. 22 is applied to the technique of the embodiment and to the conceivable technique, respectively. As may be confirmed from FIGS. 23 and 24, the simulation results obtained by the technique of the embodiment matches the simulation results obtained by the conceivable technique that does not set the sub-grids and instead performs the segmenting into sufficiently small meshes.

Figure 25:
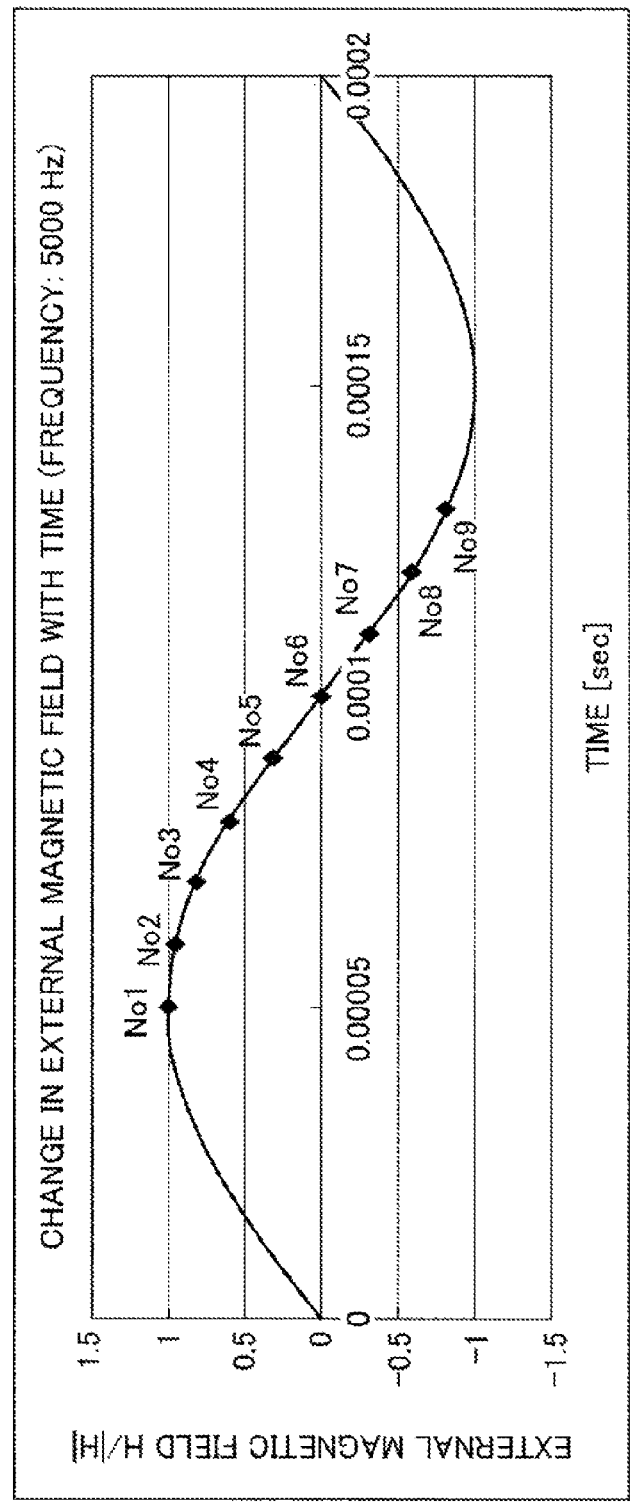
FIG. 25 is a diagram illustrating the change of the external magnetic field with time for a case in which the frequency of the external magnetic field is 5000 [Hz]
Figure 26:
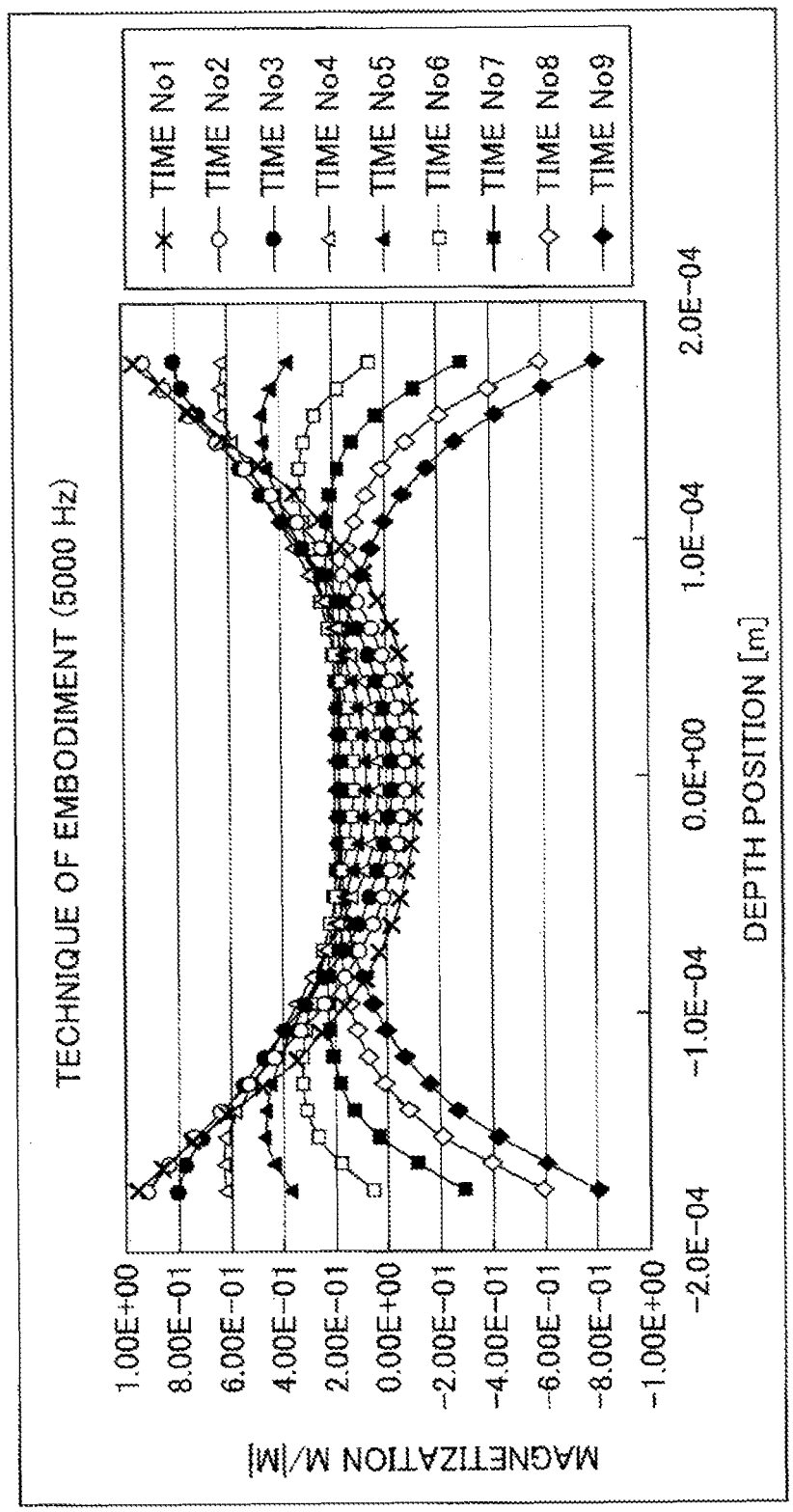
FIG. 26 is a diagram illustrating a simulation result for a case in which the external magnetic field illustrated in FIG. 25 is applied to the technique of the embodiment.
Figure 27:
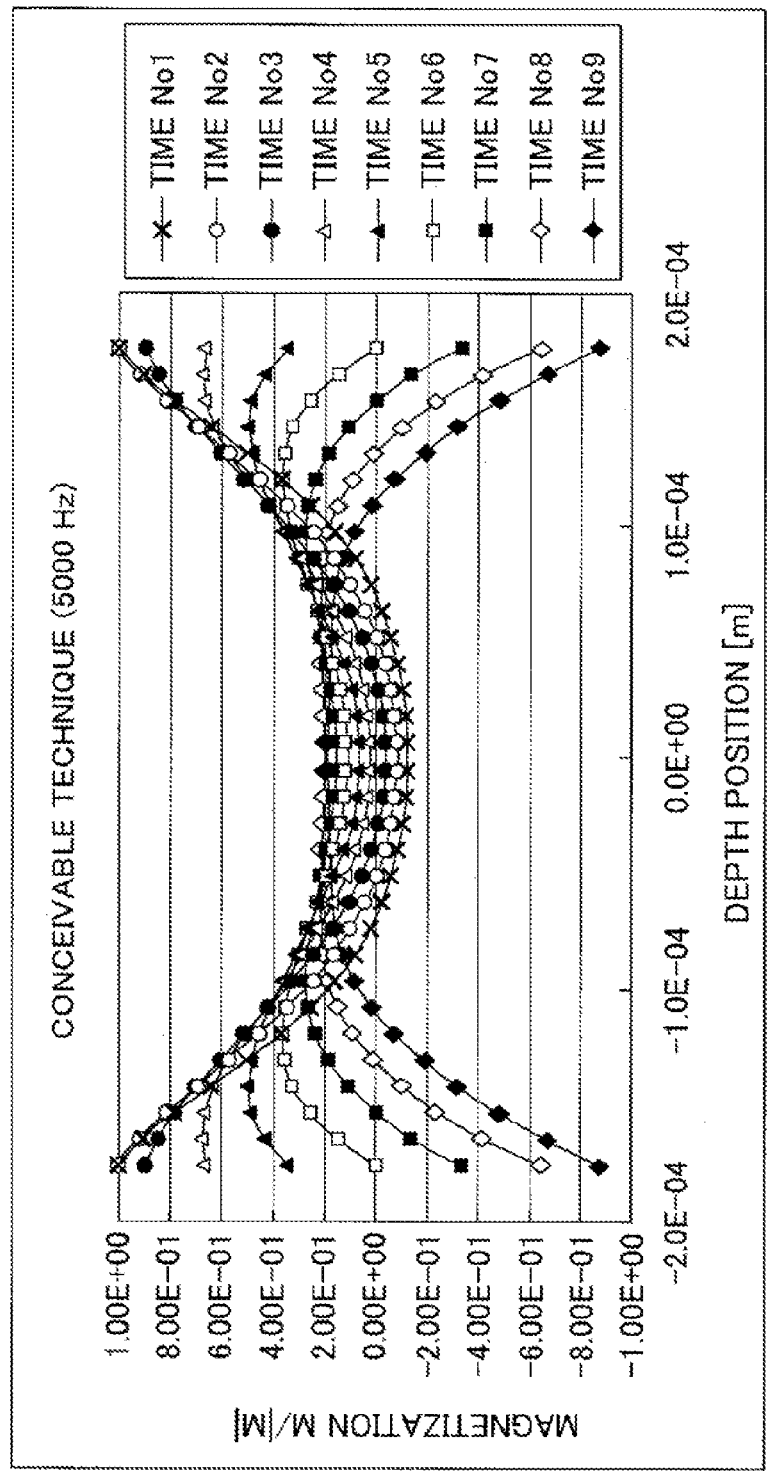
FIG. 27 is a diagram illustrating a simulation result for a case in which the external magnetic field illustrated in FIG. 25 is applied to the conceivable technique.

FIG. 25 is a diagram illustrating the change of the external magnetic field with time for a case in which the frequency of the external magnetic field is 5000 [Hz]. FIGS. 26 and 27 are diagrams illustrating simulation results for a case in which the external magnetic field illustrated in FIG. 25 is applied to the technique of the embodiment and to the conceivable technique, respectively. As may be confirmed from FIGS. 26 and 27, the simulation results obtained by the technique of the embodiment matches the simulation results obtained by the conceivable technique that does not set the sub-grids and instead performs the segmenting into sufficiently small meshes.

Figure 28:
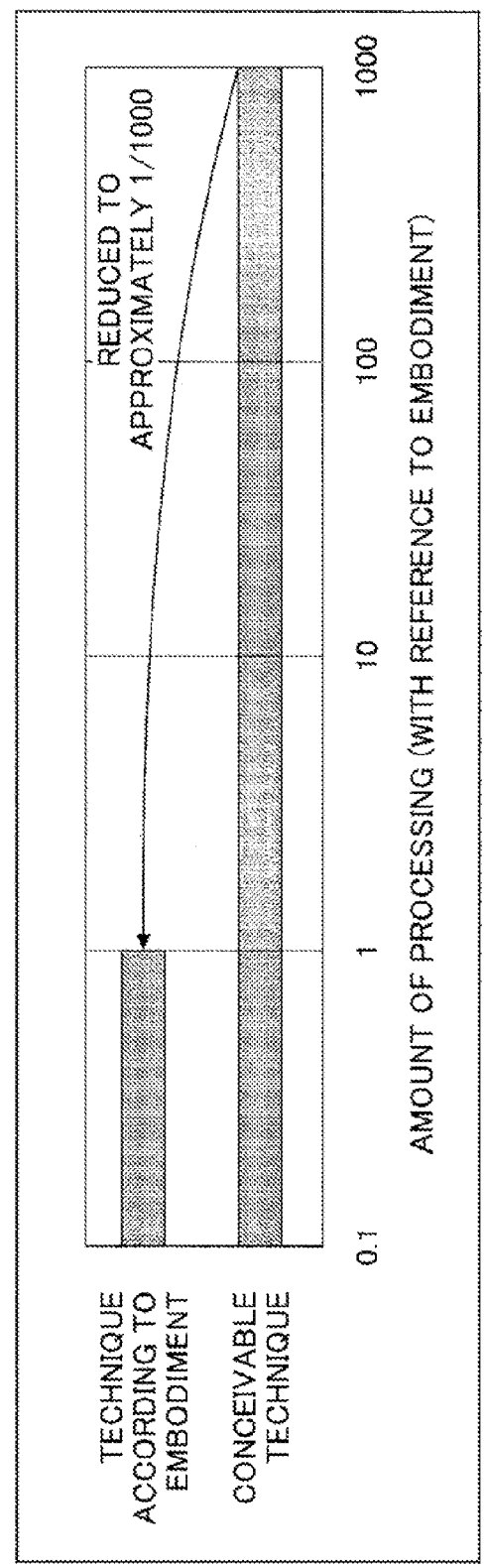
FIG. 28 is a diagram for comparing processing times of the technique of the embodiment and the conceivable technique.

Therefore, the technique of the embodiment may obtain analysis results similar to those obtained by the conceivable technique, but at a speed higher than that of the conceivable technique. FIG. 28 is a diagram for comparing processing times of the technique of the embodiment and the conceivable technique. As illustrated in FIG. 28, the processing time of the magnetic property analysis according the technique of the embodiment may be reduced to approximately 1/1000 or less when compared to that according to the conceivable technique.

Next, a description will be given of how the effect of reducing the processing time is obtained. As an example, suppose that the conceivable technique performs the computation by segmenting a single electromagnetic steel plate in the direction along the plate thickness into the meshes. For example, when the electromagnetic steel plate having a thickness of 0.35 [mm] is segmented into 32 meshes in the direction along the plate thickness, the length of one side of the mesh in the direction along the plate thickness becomes approximately 0.011 [mm]. When a mesh aspect (longer side/shorter side) tolerated by the magnetic property analysis is 9, the in-plane mesh size within the electromagnetic steel plate is approximately 0.1 [mm]. Further, when an area of a single electromagnetic steel plate forming a motor is assumed to be 10 [cm]×10 [cm], the in-plane mesh size is 100 [cm$^2$]/(0.1 [mm]×0.1 [mm])=1.0×10$^6$, and the mesh size of the electromagnetic steel plate as a whole is 3.2×10$^7$.

On the other hand, when the mesh aspect tolerated by the technique of the embodiment is 9, the in-plane mesh size is 9×0.35 [mm]=3.15 [mm], and the number of meshes is 100 [cm$^2$]/(3.15 [mm]×3.15 [mm])=1.0×10$^3$. Because the number of meshes may be reduced to (1.0×10$^3$)/3.2×10$^7$)= 3×10$^{-5}$, the processing time of the magnetic field analysis according to the technique of the embodiment may be reduced to approximately 1/1000 or less when compared to that according to the conceivable technique. In addition, since the magnetic field computation for the sub-grids is a one-dimensional computation, the load of the processing may be small and negligible when compared to a three-dimensional magnetic field computation requiring a global processing.

When the homogenization method is used in the technique of the embodiment, the LLG equation still needs to be computed within the sub-grids, and for this reason, reducing the amount of processing in the direction along the plate thickness may be difficult. However, when the number of in-plane meshes according to the technique of the embodiment and the number of in-plane meshes according to the conceivable technique are compared, the amount of processing related to the time integral of the LLG equation may be reduced by (1.0× 10$^3$)/(1.0×10$^6$)=1.0×10$^{-3}$ by applying the technique of the embodiment. As a result, the computation time related to the time integral of the LLG equation may be reduced to approximately 1/1000 or less when compared to that of the conceivable technique.

Therefore, the computation time of the magnetic field analysis may be reduced to approximately 1/1000 or less, and the computation time related to the time integral of the LLG equation may be reduced to approximately 1/1000 or less, when compared to the conceivable technique. Thus, the processing time of the magnetic property analysis as a whole according to the technique of the embodiment may be reduced to approximately 1/1000 or less when compared to the magnetic property analysis according to the conceivable technique.

In other words, it was also confirmed that the technique according to the embodiment may obtain the analysis results similar to those obtained according to the conceivable technique, and that the technique according to the embodiment may reduce the processing time compared to the conceivable technique.

[Summary]

According to the magnetic property analyzing apparatus, magnetic property analyzing method, and computer-readable storage medium in the embodiment, the magnetic property analysis may be performed at a high speed and with a high accuracy, because the sub-grids are set in the direction along the plate thickness of the plate-shaped magnetic material, and the magnetic field analysis is performed with respect to the sub-grids.

In addition, the convergence time of the macro average magnetization <<→M>> may be reduced because the integration of the LLG equation is performed a plurality of times while keeping the magnetic field component $H_1^{n+1}$ fixed (or constant) and varying the magnetic field component $H_2^{n+1}$.

For example, the LLG loop number M2 (number of LLG loops) is fixed in the embodiment described above. However, the LLG loop number M2 may be gradually decreased as the number of times the loop (B) is repeated (time-step k of the LLG equation) increases, because the variation width of the average magnetization <→M> gradually becomes smaller as the average magnetization <→M> approaches convergence.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A magnetic property analyzing apparatus comprising:
a processor configured to perform a process including first calculating vector potentials of each of elements to which an analyzing target is segmented by meshing, using an average magnetization obtained for each of the elements,
performing a magnetic field analysis of sub-grids arranged along one direction within each of the elements, and
second calculating an average magnetization with respect to each of the elements, by performing a time integral on a LLG (Landau Lifshitz Gilbert) equation using a magnetic field obtained from the magnetic field analysis in order to perform a magnetic property analysis, wherein the second calculating includes
after the magnetic field is calculated by the magnetic field analysis, calculating an effective magnetic field acting on each of the elements by keeping the magnetic field to a fixed value,
calculating magnetization vectors within each of sub-elements including the sub-grids by performing a time integral of the LLG equation using the effective magnetic field, and
calculating the average magnetization with respect to each of the elements by averaging magnetization vectors calculated for each of the sub-elements.

2. The magnetic property analyzing apparatus as claimed in claim 1, wherein a process of the first calculating, and a process of the performing and the second calculating are alternately repeated.

3. The magnetic property analyzing apparatus as claimed in claim 1, the second calculating includes
after calculating the magnetic field by the magnetic field analysis, performing a first process of calculating the magnetization vector and calculating the average magnetization with respect to each of the elements a plurality of times by recursively reflecting the average magnetization calculated by the second calculating to the effective magnetic field.

4. The magnetic property analyzing apparatus as claimed in claim 3, wherein the second calculating calculates the average magnetization with respect to each of the elements, by alternately executing a process of calculating the magnetic field by the magnetic field analysis and the first process a plurality of times.

5. The magnetic property analyzing apparatus as claimed in claim 3, wherein a number of times the first process is executed gradually decreases depending on a lapse of time in which the external magnetic field remains unchanged.

6. A magnetic property analyzing apparatus comprising:
a processor configured to perform a process including
first calculating vector potentials of each of elements to which an analyzing target is segmented by meshing, using an average magnetization obtained for each of the elements,
performing a magnetic field analysis of sub-grids arranged along one direction within each of the elements, and
second calculating an average magnetization with respect to each of the elements, by performing a time integral on a LLG (Landau Lifshitz Gilbert) equation using a magnetic field obtained from the magnetic field analysis in order to perform a magnetic property analysis, wherein the second calculating includes
calculating, by the processor, the effective magnetic field by reflecting an external magnetic field as a set value,
after executing a process of calculating the average magnetization with respect to each of the elements, judging, by the processor, whether an index value indicating a change between the average magnetization calculated in a currently executed process of calculating the average magnetization with respect to each of the elements and the average magnetization calculated in a previously executed process of calculating the average magnetization with respect to each of the elements executed before the currently executed process, and
modifying, by the processor, the external magnetic field when the index value is less than a predetermined value.

7. The magnetic property analyzing apparatus as claimed in claim 6, wherein the performing includes
when the index value is less than the predetermined value, outputting from the processor, as an analysis result, a combination of a value corresponding to the average magnetization calculated by the process of calculating the average magnetization with respect to each of the elements, and the external magnetic field that is set when the index value is less than the predetermined value.

8. A magnetic property analyzing method comprising:
first calculating, by a processor, vector potentials of each of elements to which an analyzing target is segmented by meshing, using an average magnetization obtained for each of the elements;
performing, by the processor, a magnetic field analysis of sub-grids arranged along one direction within each of the elements; and
second calculating, by the processor, an average magnetization with respect to each of the elements, by performing a time integral on a LLG (Landau Lifshitz Gilbert) equation using a magnetic field obtained from the magnetic field analysis in order to perform a magnetic property analysis, wherein the second calculating includes
after the magnetic field is calculated by the magnetic field analysis, calculating, by the processor, an effective magnetic field acting on each of the elements by keeping the magnetic field to a fixed value,
calculating, by the processor, magnetization vectors within each of sub-elements including the sub-grids by performing a time integral of the LLG equation using the effective magnetic field, and
calculating, by the processor, the average magnetization with respect to each of the elements by averaging magnetization vectors calculated for each of the sub-elements.

9. The magnetic property analyzing method as claimed in claim 8, wherein a process of the first calculating, and a process of the performing and the second calculating are alternately repeated.

10. The magnetic property analyzing method as claimed in claim 8, further comprising:
after calculating the magnetic field by the magnetic field analysis, performing, by the processor, a first process of calculating the magnetization vector and calculating the average magnetization with respect to each of the elements a plurality of times by recursively reflecting the average magnetization calculated by the second calculating to the effective magnetic field.

11. A non-transitory computer-readable storage medium having stored therein a program for causing a computer to execute a process comprising:
first calculating vector potentials of each of elements to which an analyzing target is segmented by meshing, using an average magnetization obtained for each of the elements;
performing a magnetic field analysis of sub-grids arranged along one direction within each of the elements; and
second calculating an average magnetization with respect to each of the elements, by performing a time integral on a LLG (Landau Lifshitz Gilbert) equation using a magnetic field obtained from the magnetic field analysis in order to perform a magnetic property analysis, wherein the second calculating includes
after the magnetic field is calculated by the magnetic field analysis, calculating an effective magnetic field acting on each of the elements by keeping the magnetic field to a fixed value,
calculating magnetization vectors within each of sub-elements including the sub-grids by performing a time integral of the LLG equation using the effective magnetic field, and
calculating the average magnetization with respect to each of the elements by averaging magnetization vectors calculated for each of the sub-elements.

12. The non-transitory computer-readable storage medium as claimed in claim 11, wherein a process of the first calculating, and a process of the performing and the second calculating are alternately repeated.

13. The non-transitory computer-readable storage medium as claimed in claim 11, wherein the second calculating includes
after calculating the magnetic field by the magnetic field analysis, performing a first process of calculating the magnetization vector and calculating the average magnetization with respect to each of the elements a plurality of times by recursively reflecting the average magnetization calculated by the second calculating to the effective magnetic field.

14. The non-transitory computer-readable storage medium as claimed in claim 13, wherein the second calculating performs a process of calculating the average magnetization with respect to each of the elements, by alternately executing a process of calculating the magnetic field by the magnetic field analysis and the first process a plurality of times.

15. The non-transitory computer-readable storage medium as claimed in claim 13, wherein a number of times the first process is executed gradually decreases depending on a lapse of time in which the external magnetic field remains unchanged.

16. A non-transitory computer-readable storage medium having stored therein a program for causing a computer to execute a process comprising:
first calculating vector potentials of each of elements to which an analyzing target is segmented by meshing, using an average magnetization obtained for each of the elements;
performing a magnetic field analysis of sub-grids arranged along one direction within each of the elements; and
second calculating an average magnetization with respect to each of the elements, by performing a time integral on a LLG (Landau Lifshitz Gilbert) equation using a magnetic field obtained from the magnetic field analysis in order to perform a magnetic property analysis, wherein the second calculating includes
calculating the effective magnetic field by reflecting an external magnetic field as a set value,
after executing a process of calculating the average magnetization with respect to each of the elements, judging whether an index value indicating a change between the average magnetization calculated in a currently executed process of calculating the average magnetization with respect to each of the elements and the average magnetization calculated in a previously executed process of calculating the average magnetization with respect to each of the elements executed before the currently executed process, and
modifying the external magnetic field when the index value is less than a predetermined value.

17. The non-transitory computer-readable storage medium as claimed in claim 16, wherein the performing includes
when the index value is less than the predetermined value, causing the computer to output, as an analysis result, a combination of a value corresponding to the average magnetization calculated by the process of calculating the average magnetization with respect to each of the elements, and the external magnetic field that is set when the index value is less than the predetermined value.

* * * * *